United States Patent
Kang et al.

(10) Patent No.: US 11,184,989 B2
(45) Date of Patent: Nov. 23, 2021

(54) COVER CAPABLE OF STORING PEN AND ELECTRONIC DEVICE INCLUDING THE SAME

(71) Applicant: Samsung Electronics Co., Ltd., Gyeonggi-do (KR)

(72) Inventors: Namhyun Kang, Gyeonggi-do (KR); Minah Koh, Gyeonggi-do (KR); Mingeun Kim, Gyeonggi-do (KR); Hakdo Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/941,762

(22) Filed: Jul. 29, 2020

(65) Prior Publication Data
US 2021/0037666 A1    Feb. 4, 2021

(30) Foreign Application Priority Data
Aug. 2, 2019  (KR) .......................... 10-2019-0094567

(51) Int. Cl.
*H05K 5/03*     (2006.01)
*H05K 5/02*     (2006.01)
*G06F 3/0354*   (2013.01)

(52) U.S. Cl.
CPC ........... *H05K 5/03* (2013.01); *G06F 3/03545* (2013.01); *H05K 5/0226* (2013.01)

(58) Field of Classification Search
CPC ....................................................... G06F 1/16
See application file for complete search history.

(56) References Cited

U.S. PATENT DOCUMENTS

| | | |
|---|---|---|
| 9,748,999 B2 | 8/2017 | Nyholm et al. |
| 10,310,557 B1 | 6/2019 | Wu |

(Continued)

FOREIGN PATENT DOCUMENTS

| | | |
|---|---|---|
| CN | 202774736 U | 3/2013 |
| CN | 205809783 U | 12/2016 |
| CN | 208400044 U | 1/2019 |

OTHER PUBLICATIONS

International Search Report dated Nov. 26, 2020.

*Primary Examiner* — Jerry Wu
(74) *Attorney, Agent, or Firm* — Cha & Reiter, LLC

(57) ABSTRACT

The present invention relates to a cover for an electronic device. The cover is attachable to an electronic device and includes a first plate having an opening, the first plate configured to cover a first part of a rear surface of the electronic device, a second plate disposed adjacent to the first plate and configured to cover a second part of the rear surface of the electronic device, a third plate disposed adjacent to the second plate and configured to cover a third part of the rear surface of the electronic device, a pen storage part coupled to the opening of the first plate, an outer skin configured to wrap one surface of each of the first plate, the second plate, and the third plate, and a hinge configured to rotatably couple the second plate and the third plate, wherein the first plate is rotatable within a first designated angle range with respect to the second plate via the outer skin, wherein the third plate is rotatable within a second designated angle range with respect to the second plate via the hinge, and wherein the first plate is formed of a first material, and the pen storage part is formed of a second material having a hardness different from a hardness of the first material.

15 Claims, 18 Drawing Sheets

(56) References Cited

U.S. PATENT DOCUMENTS

| | | | |
|---|---|---|---|
| 2011/0290687 A1* | 12/2011 | Han | ........................ A45C 3/02 206/320 |
| 2015/0237979 A1 | 8/2015 | Huang | |
| 2016/0026218 A1 | 1/2016 | Jefferies et al. | |
| 2018/0210507 A1* | 7/2018 | Morrison | ................ G06F 1/189 |

* cited by examiner

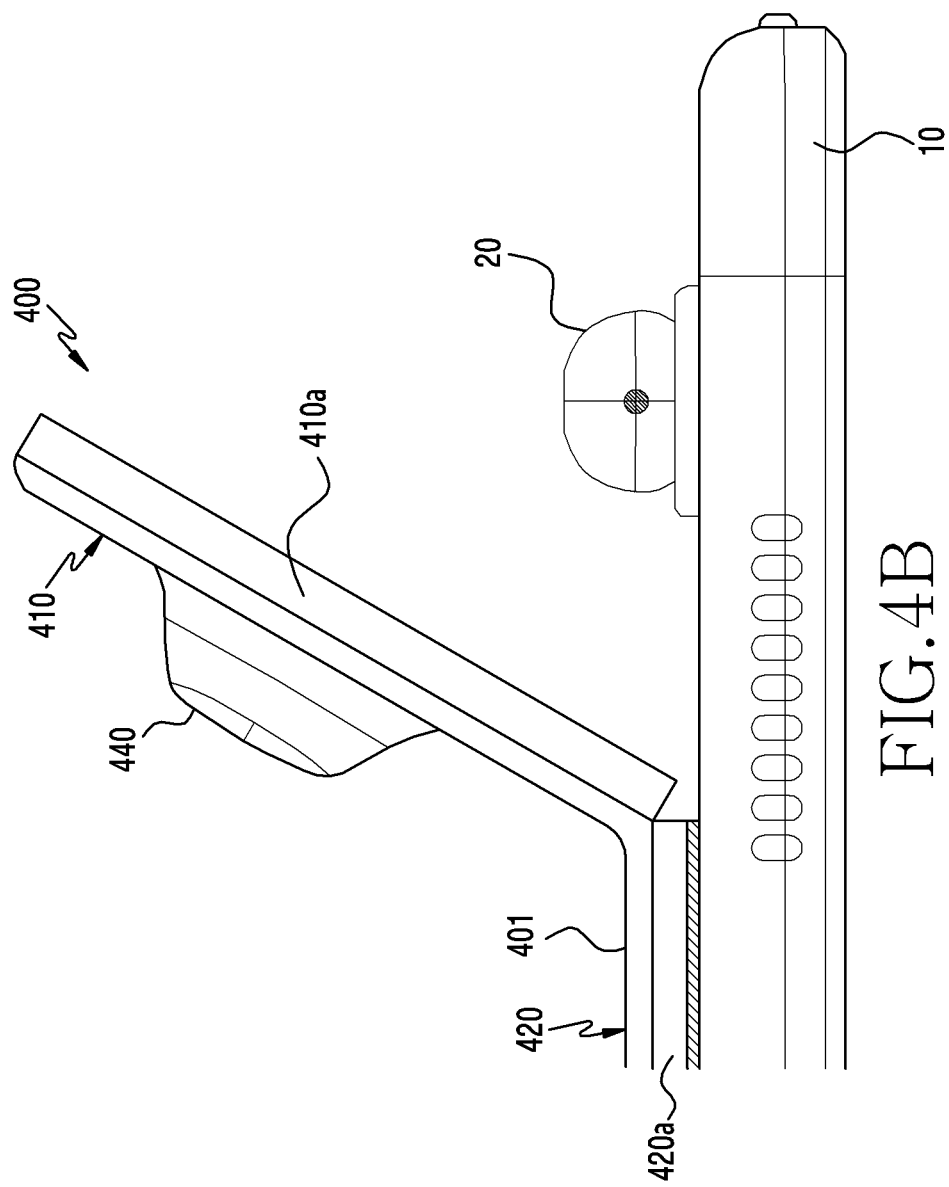

though these are not prior art with regard to the disclosure.

COVER CAPABLE OF STORING PEN AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0094567, filed on Aug. 2, 2019, in the Korean Intellectual Property Office, the disclosure of which is herein incorporated by reference in its entirety.

BACKGROUND

1) Field

Certain embodiments relate to a cover capable of accommodating a pen and an electronic device including the same.

2) Description of Related Art

Electronic devices may be equipped with a touch screen that allows input and output to be simultaneously performed. Some touch screens include large screen areas to facilitate ease of use. Further, peripheral devices of electronic devices have also advanced in sophistication along with the rapid development of electronic devices.

As the screen area of touch screens have been gradually enlarged in electronic devices, electronic pens (e.g., stylus pens) may be used as input devices. Users may generate inputs by contacting the touch screen using an electronic stylus pen.

Users are generally able to generate certain types of input such as a picture in addition to text data using electronic pens. Thus, electronic pens have been increasingly used in the electronic devices equipped with a large screen touch screen, such as tablet PCs and smartphones.

The above information is presented as background information only to assist with an understanding of the disclosure. No determination has been made, and no assertion is made, as to whether any of the above might be applicable as prior art with regard to the disclosure.

SUMMARY

As electronic pens have been increasingly used, a prevention of damage to the electronic pens or loss of the electronic pens due to external impact has become more needful.

Accordingly, a recess in the device may be formed for storing an electronic pen in one side surface of a cradle attached to an electronic device, and to store the electronic pen using the formed recess. However, when the electronic pen is stored in the recess, in order to remove the electronic pen out of the recess, the user must generally insert a finger into the recess and push the electronic pen with the finger, which may render removal of the pen cumbersome.

Another method involves forming a slot, holder or pouch for affixing a stylus pen on a side surface or rear side of a cover attached to the electronic device, and to secure the electronic pen by inserting the electronic pen into the pouch. However, in the case of this method, since the electronic pen is fixed and stored in the pouch, it may be somewhat inconvenient to store the electronic device. Furthermore, the electronic pen may be exposed to an external impact, which may damage it.

This disclosure is to provide a cover including a pen storage part capable of protecting an electronic pen from an external impact while facilitating removal of the electronic pen by forming a space capable of storing the electronic pen between one surface of the electronic device and the cover.

A cover according to certain embodiments relates to a cover attached to an electronic device. The cover may include: a first plate having an opening, the first plate configured to cover a first part of a rear surface of the electronic device, a second plate disposed adjacent to the first plate and configured to cover a second part of the rear surface of the electronic device, a third plate disposed adjacent to the second plate and configured to cover a third part of the rear surface of the electronic device, a pen storage part coupled to the opening of the first plate, an outer skin configured to wrap one surface of each of the first plate, the second plate, and the third plate, and a hinge configured to rotatably couple the second plate and the third plate, wherein the first plate is rotatable within a first designated angle range with respect to the second plate via the outer skin, wherein the third plate is rotatable within a second designated angle range with respect to the second plate via the hinge, and wherein the first plate is formed of a first material, and the pen storage part is formed of a second material having a hardness different from a hardness of the first material.

A cover according to certain embodiments is a cover attached to an electronic device. The cover may include: a plurality of plates configured to cover a front surface of the electronic device, a first plate having an opening, and configured to cover a first part of a rear surface of the electronic device, a second plate spaced apart from the first plate by a first interval and configured to cover a second part of the rear surface of the electronic device, a pen storage part coupled to the opening of the first plate, an outer skin configured to wrap a first set of surfaces of each of the plurality of plates, the first plate, and the second plate, and an inner skin configured to wrap a second set of surfaces of each of the plurality of plates, the first plate, and the second plate, wherein the first plate is configured to be rotatable about the first interval within a designated angle range with respect to the second plate via the outer skin, and wherein the first plate is formed of a first material, and the pen storage part is formed of a second material having a hardness different from a hardness of the first material.

An electronic device according to certain embodiments may include: a cover configured to be attachable to a rear surface of the electronic device, a seating recess formed in the rear surface of the electronic device, and a pen configured to be removably seated within the seating recess, wherein the cover includes: a first plate having an opening and configured to cover a first part of a rear surface of the electronic device, a second plate disposed adjacent to the first plate and configured to cover a second part of the rear surface of the electronic device, a third plate located adjacent to the second plate and configured to cover a third part of the rear surface of the electronic device, a pen storage part coupled to the opening in the first plate so as to provide a space capable of storing the pen, an outer skin configured to wrap a first set of surfaces of the first plate, the second plate, and the third plate, and a hinge configured to rotatably couple the second plate and the third plate, wherein the first plate is configured to be rotatable within a first designated angle range with respect to the second plate via the outer skin, wherein the third plate is configured to be rotatable within a second designated angle range with respect to the second plate via the hinge, and wherein the first plate is formed of a first material, and the pen storage part is formed of a second material having a hardness lower than a hardness of the first material.

With a cover according to certain embodiments, a space capable of storing an electronic pen is provided between one surface of the electronic device and the cover, thereby preventing the electronic pen from being damaged or lost due to an external impact.

In addition, with a cover according to certain embodiments, it is possible to improve convenience of storage and portability, and to improve aesthetics by preventing the electronic pen from being exposed to the outside.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4B is a view illustrating the state in which a portion of the cover is spaced apart from one surface of an electronic device;

DETAILED DESCRIPTION

Figure 1:
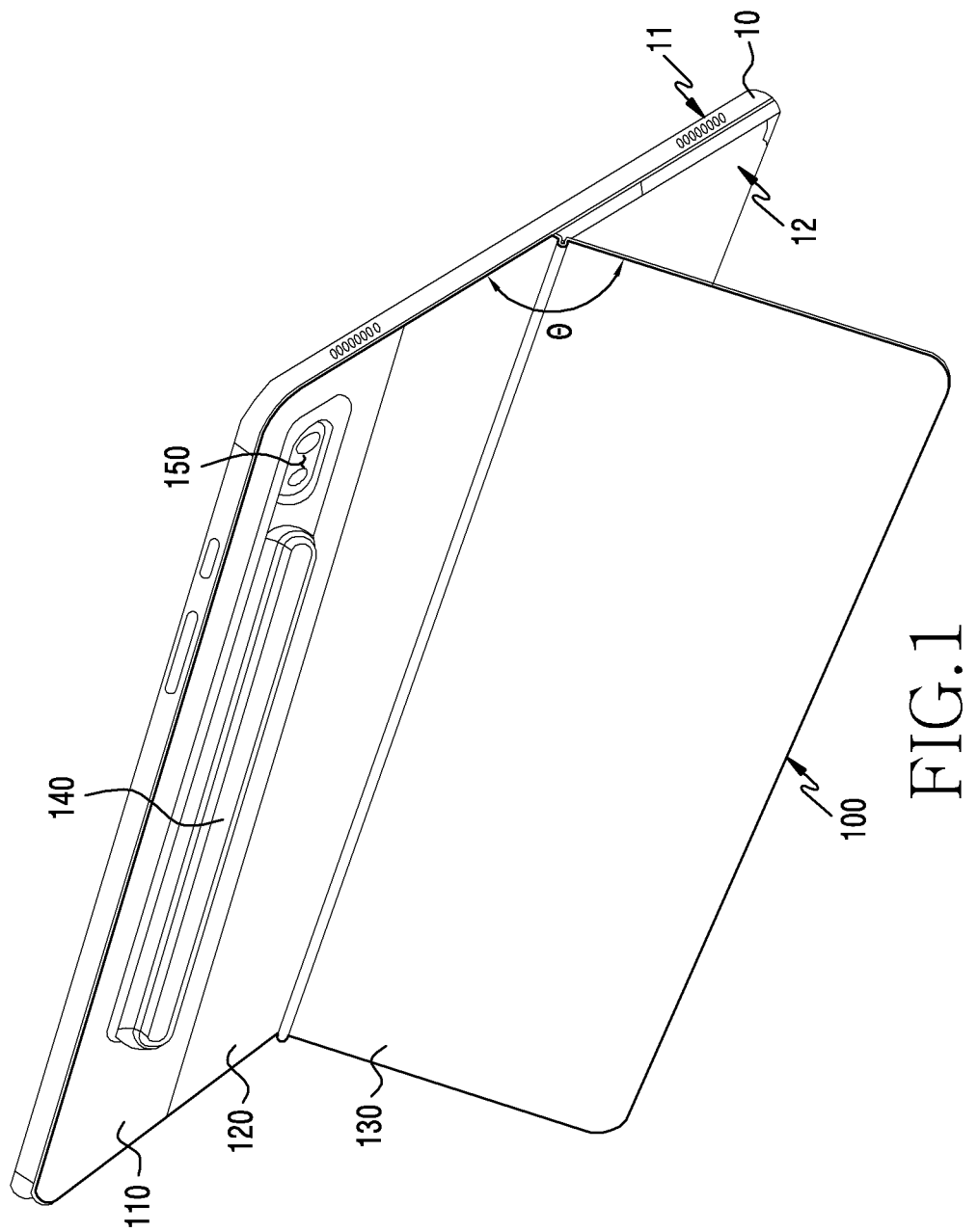
FIG. 1 is a perspective view illustrating the state in which a cover according to certain embodiments is attached to one surface of an electronic device.

The electronic device according to certain embodiments may be one of certain types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include certain changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

According to certain embodiments, each component (e.g., a module or a program) of the above-described components may include a single entity or multiple entities. According to certain embodiments, one or more of the above-described components may be omitted, or one or more other components may be added.

Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

FIG. 1 is a perspective view illustrating the state in which a cover 100 according to certain embodiments is attached to one surface of an electronic device 10.

Referring to FIG. 1, the cover 100 according to an embodiment may be attached to one surface of the electronic device 10 so as to protect the one surface of the electronic device 10. As an example, the cover 100 may be attached to the rear surface 12 of the electronic device 10 so as to protect the rear surface 12 of the electronic device 10. According to an embodiment, the cover 100 may be attached to the front surface 11 of the electronic device 10 to protect a display (not illustrated) exposed on the front surface 11 of the electronic device 10.

The cover 100 according to an embodiment may include a first region 110, a second region 120, a third region 130, and a pen storage part 140 coupled to a portion of the first region 110.

According to an embodiment, magnets (not illustrated) are mounted inside each of the first region 110, the second region 120, and the third region 130 so that the first region 110, the second region 120, and the third region 130, as attached to one surface of the electronic device 10, may protect the surface of the electronic device 10.

According to an embodiment, when the second region 120 is attached to the one surface of the electronic device 10, the first region 110 and the third region 130 may be rotated about the second region 120 independently from each other. As an example (see FIG. 1), in the state in which the second region 120 is attached to the rear surface 12 of the electronic device 10, the electronic device 10 may be mounted by rotating the third region 130 by a predetermined angle θ. A detailed description of the process in which the first region 110 and the third region 130 are rotated about the second region 120 independently from each other will be described later.

According to an embodiment, the pen storage part 140 may protrude from a surface of at least one region of the first region 110. When the first region 110 is attached to one surface of the electronic device 10, the pen storage part 140 may provide a space capable of storing a pen between the first region 110 and the one surface of the electronic device 10, which will be described in more detail later.

According to an embodiment, a hole 150 may be formed in a region of the pen storage part 140. When the cover 100 is attached to one surface of the electronic device 10, a region of the electronic device 10 may be exposed to the outside of the cover 100 through the hole 150. As an example, when the cover 100 is attached to the rear surface 12 of the electronic device 10, a camera module on the rear surface of the electronic device 10 can be exposed to the outside of the cover 100 through the hole 150. Thus, the user can utilize the camera module even when the cover 100 is attached to the electronic device 10.

Figure 2A:
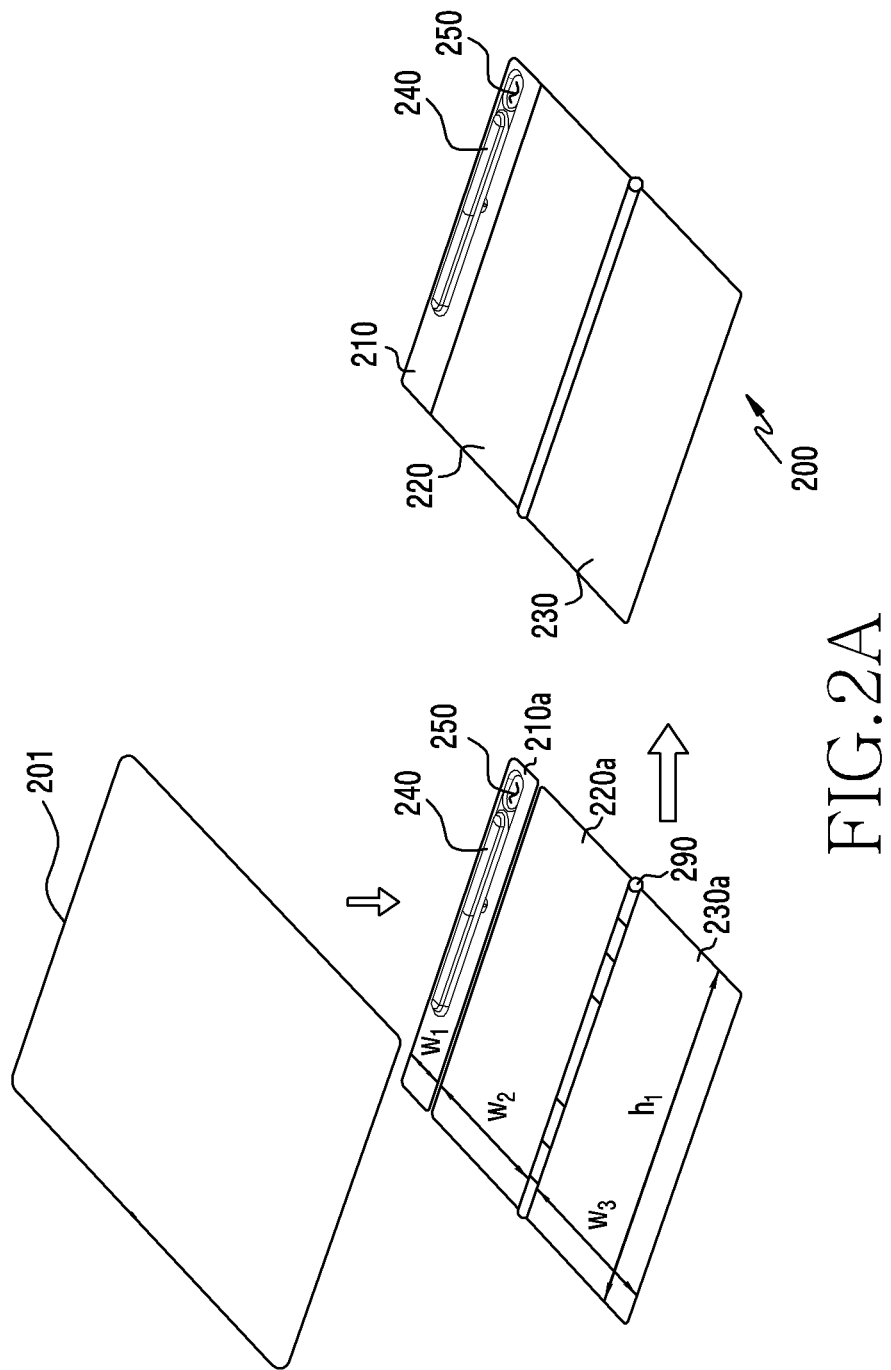
FIG. 2A shows perspective views illustrating a cover according to an embodiment in a disassembled state and an assembled state.
Figure 2B:
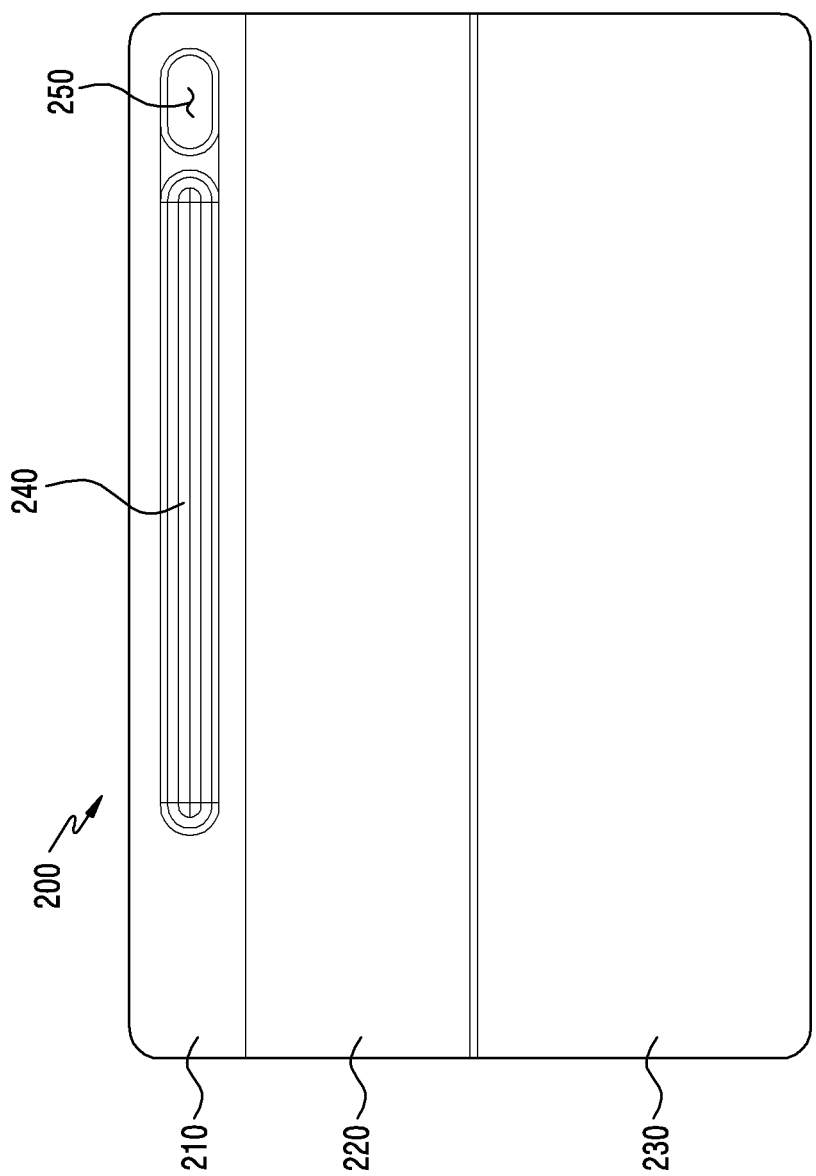
FIG. 2B is a front view of a cover according to an embodiment.
Figure 2C:
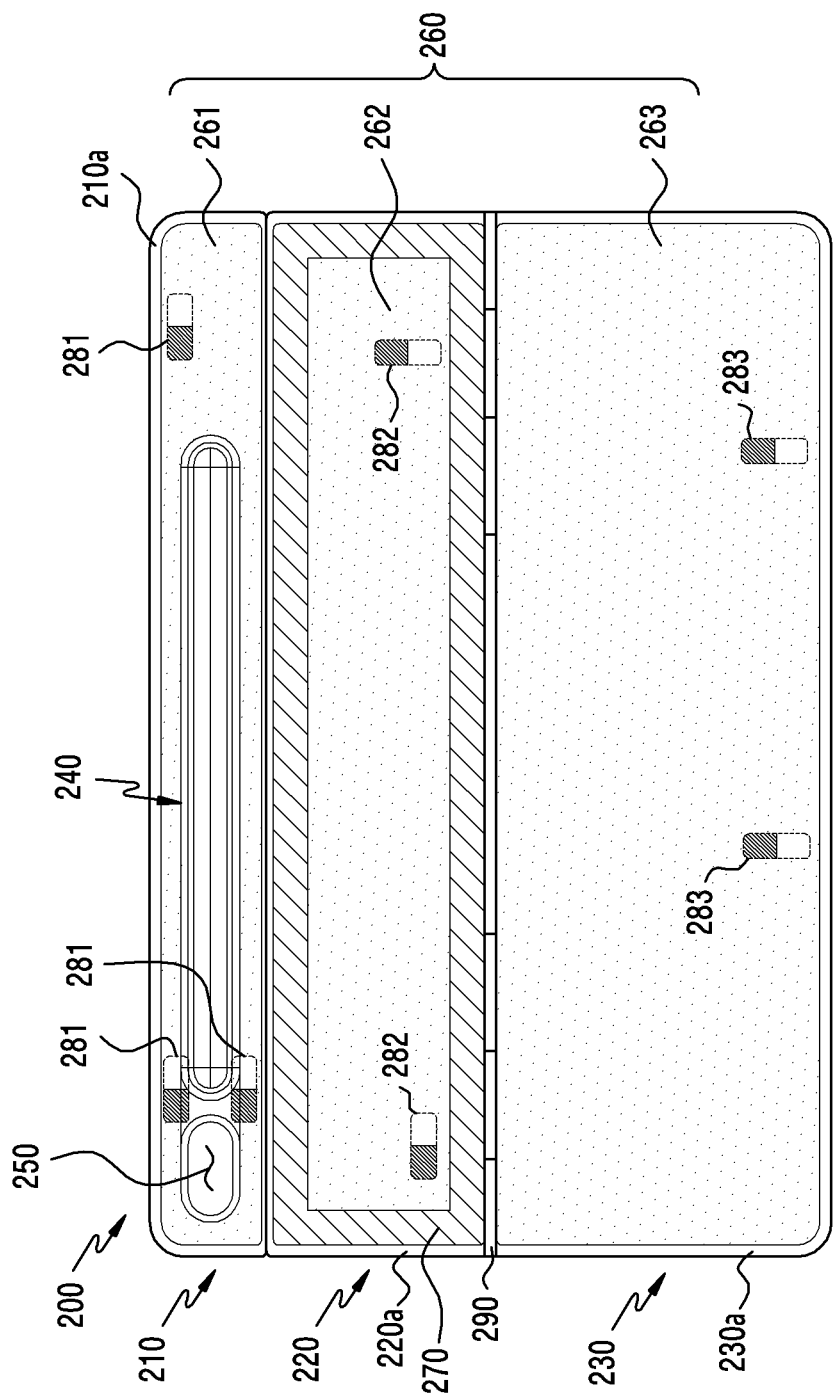
FIG. 2C is a rear view of the cover of FIG. 2B.
Figure 2D:
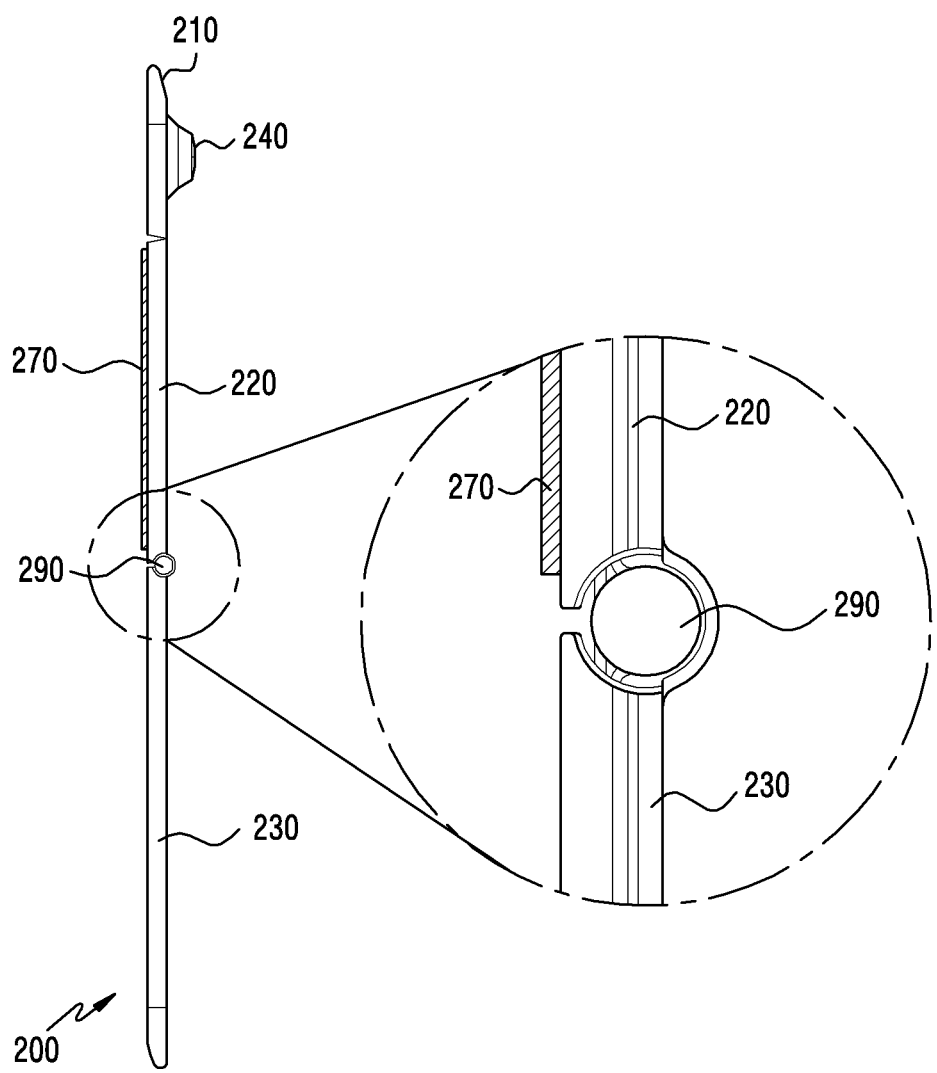
FIG. 2D is a side view of the cover of FIG. 2B.
Figure 2E:
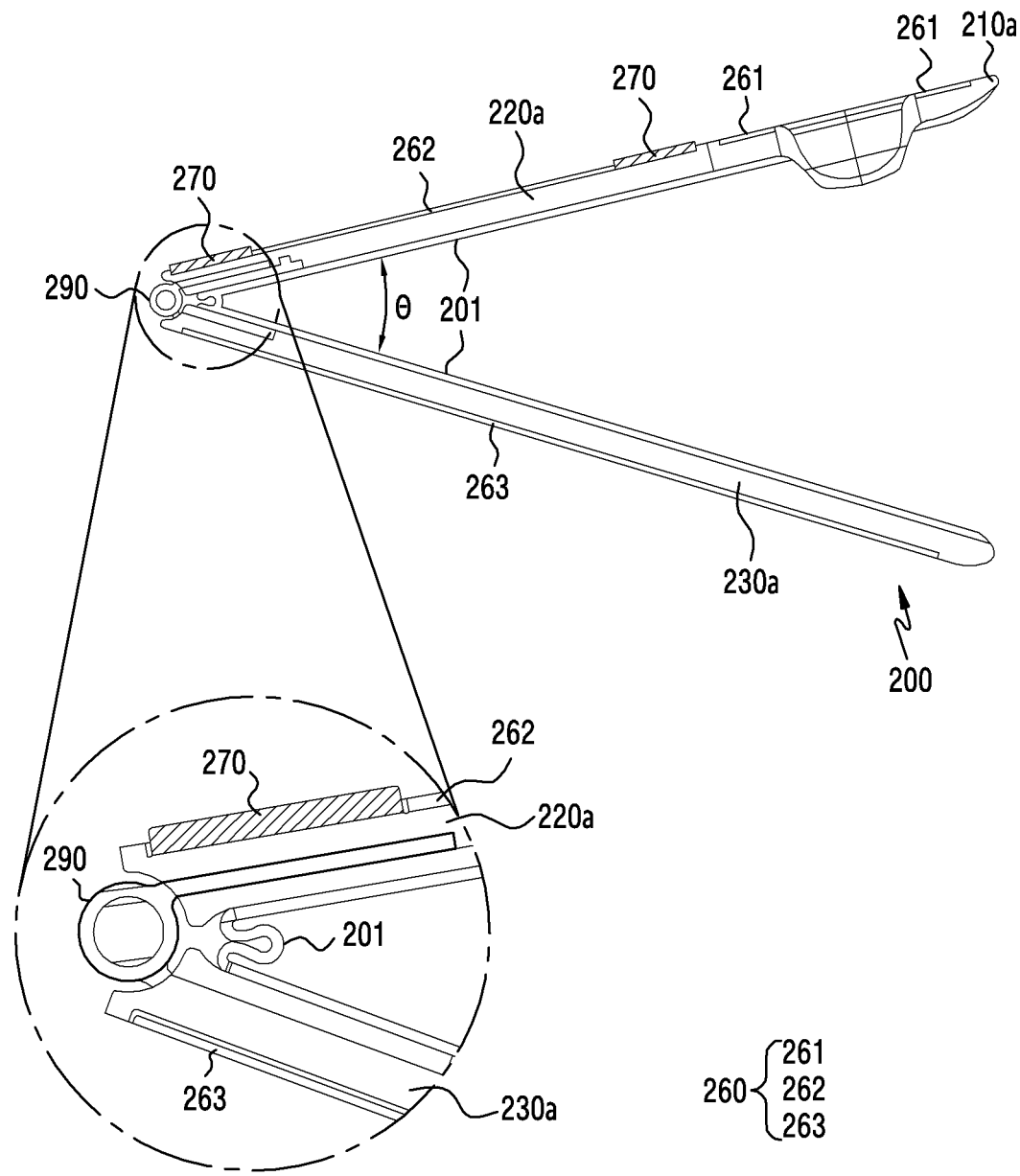
FIG. 2E is a cross-sectional view of the cover of FIG. 2B.

FIG. 2A shows perspective views illustrating a cover 200 according to an embodiment in a disassembled state and an assembled state. FIG. 2B is a front view of the cover 200 according to an embodiment. FIG. 2C is a rear view of the cover 200 of FIG. 2B. FIG. 2D is a side view of the cover 200 of FIG. 2B. FIG. 2E is a cross-sectional view of the cover 200 of FIG. 2B.

Referring to FIGS. 2A to 2E, the cover 200 according to an embodiment may include a first plate 210a, a second plate 220a, a third plate 230a, and a pen storage part 240. At least one of the components of the cover 200 of FIGS. 2A to 2E may be the same as or similar to at least one of the components of the cover 100 of FIG. 1, and a repetitive description thereof will be omitted below.

Referring to FIG. 2A, the first plate 210a according to an embodiment may be formed to have a first width w1 and a first height h1, the second plate may be formed to have a second width w2 and the first height h1, and the third plate may be formed to have a third width w3 and the first height h1. At this time, at least two of the first width w1, the second width w2, and the third width w3 may be the same, and according to an embodiment, all of the first width w1, the second width w2, and the third width w3 may be different from each other.

According to an embodiment, an outer skin 201 may be attached to one surface of each of the first plate 210a, the second plate 220a, and the third plate 230a, and the outer skin 201 may protect the one surface of each of the first plate 210a, the second plate 220a, and the third plate 230a. According to an embodiment, the cover 200 may be divided into a first region 210, a second region 220, and a third region 230, depending on which plates the outer skin 201 is attached to. As an example, among the regions to which the outer skin 201 is attached, a region corresponding to the first plate 210a may be distinguished as a first region 210, a region corresponding to the second plate 220a may be distinguished as a second region, and a region corresponding to the third plate 230a may be distinguished as a third region 230. The outer skin 201 may be formed of, for example, polyurethane (PU), leather, a synthetic material, or a fabric material, but is not limited thereto.

The first plate 210a and the second plate 220a may be interconnected by the outer skin 201 attached to one surface of each of the first plate 210a and the second plate 220a, and the first plate 210a may be independently rotated about the second plate 220a by way of the outer skin 201. As an example, the first plate 210a may be spaced apart from one surface of the electronic device in the state in which the second plate 220a is attached to the one surface of the electronic device (e.g., the electronic device 10 of FIG. 1).

The second plate 220a and the third plate 230a may be rotatably coupled to each other via a hinge structure 290 located therebetween, and the hinge structure 290 may not be visible to the outside of the cover 200 by the outer skin 201. The third plate 230a may be independently rotated about the hinge structure 290 within a designated angle θ with respect to the second plate 220a. As an example, the third plate 230a may be rotate within an angle range of 10 degrees to 180 degrees with respect to the second plate 220a. According to an embodiment, in the state in which the second plate 220a is attached to one surface of the electronic device, the third plate 230a may be rotated relative to the second plate 220a so as to mount the electronic device with the help of the third plate 230a, which will be described in more detail later.

According to an embodiment, an opening (not illustrated) may be formed in a region of the first plate 210a, and the pen storage part 240 may be disposed in the region of the first plate 210a in a manner of being assembled to the opening. According to another embodiment, the pen storage part 240 may be disposed in the region of the first plate 210a in a manner of being attached to the opening using adhesive tape or through bonding, and according to an embodiment, the pen storage part 240 may be disposed in the region of the first plate 210a in a manner of being welded to the opening. According to another embodiment, the pen storage part 240 may be disposed in the region of the first plate 210a in a manner of being injection-molded in the opening (e.g., through double injection molding or insert injection molding).

According to an embodiment, the first plate 210a, the second plate 220a, and the third plate 230a may be formed of a material having a hardness different from that of the material of the pen storage part 240. Depending on the environment in which the cover 200 is used, the case where the pen storage part 240 comes into the ground may occur. When the pen storage part 240 is formed of a material having a high hardness, the pen storage part 240 may be damaged in the process of coming into contact with the ground. Thus, the pen storage part 240 may be formed of a material having a lower hardness than that of the first plate 210a, the second plate 220a, and the third plate 230a. According to an embodiment, the first plate 210a, the second plate 220a, and the third plate 230a may be formed of a polycarbonate (PC) material having excellent rigidity and flatness and good corrosion resistance, and the pen storage part 240 may be formed of a thermoplastic polyurethane (TPU) material having a hardness lower than that of the polycarbonate material. However, this disclosure is not limited thereto.

That is, the pen storage part 240 may be formed of a material having a relatively low hardness so as to prevent the pen storage part 240 from being damaged in the process of using the cover 200, and the first plate 210*a*, the second plate 220*a*, and the third plate 230*a* may be formed of a material having a relatively high hardness so as to increase the rigidity and flatness of the cover 200.

According to an embodiment, a hole 250 may be formed in a region of the pen storage part 240 through the region of the pen storage part 240. According to an embodiment, the hole 250 may be a hole formed by processing (e.g., cutting) the region of the pen storage part 240, but according to another embodiment, the hole 250 may be a portion of an opening in which the pen storage part 240 is not disposed.

At least one mounting space (not illustrated) may be formed in each of the first plate 210*a*, the second plate 220*a*, and the third plate 230*a* according to an embodiment, and magnets 281, 282, and 282 may be mounted in respective mounting spaces. According to an embodiment, the first magnet 281 may be mounted in the mounting space formed in the first plate 210*a*, the second magnet 282 may be mounted in the mounting space formed in the second plate 220*a*, and the third magnet 283 may be mounted in the mounting space formed in the third plate 230*a*. The first magnet 281, the second magnet 282, and the third magnet 283 may enable the first plate 210*a*, the second plate 220*a*, and the third plate 230*a* to be respectively fixed to one surface of the electronic device when the first plate 210*a*, the second plate 220*a*, and the third plate 230*a* are fixed to the one surface of the electronic device.

According to an embodiment, a film 260 formed of an opaque material may be attached to another surface of each of the first plate 210*a*, the second plate 220*a*, and the third plate 230*a* (see, e.g., FIG. 2B) opposite to the one surface of each of the first plate 210*a*, the second plate 220*a*, and the third plate 230*a* to which the outer skin is attached (see, e.g., FIG. 2A). As an example, a first film 261 may be attached to the another surface of the first plate 210*a*, and the first film 261 may make the first magnet 281, mounted in the mounting space in the first plate 210*a*, invisible from the outside of the cover 200. As another example, a second film 262 may be attached to the another surface of the second plate 220*a*, and a third film 263 may be attached to the another surface of the third plate 230*a*, and the second film 262 and the third film 263 may make the second and third magnets 282 and 283, mounted in the mounting spaces in the second and third plates 220*a* and 230*a*, invisible from the outside of the cover 200.

According to an embodiment, when the cover 200 is attached to one surface of the electronic device, the first and third plate 210*a* and 230*a* may be independently rotated about the second plate 220*a* in the state in which the second plate 220*a* is attached to the one surface of the electronic device. As an example, in the state in which the second plate 220*a*, the first plate 210*a* and/or the third plate 230*a* may be spaced from the one surface of the electronic device.

The second plate 220*a* may slide on the one surface of the electronic device while the user rotates the first plate 210*a* and/or the third plate 230*a*. Thus, a pad 270 may be attached to one surface of the second plate 220*a*. According to an embodiment, the pad 270 is formed of a highly frictional material (e.g., rubber) so as to prevent slipping when the second plate 220*a* is attached to the one surface of the electronic device. According to an embodiment, the pad 270 may be attached to at least one region of the second film 262 attached to the second plate 220*a*. As an example, the pad 270 may be formed in, for example, a rectangular band shape and may be attached to surround all of the edges of the second film 262. According to another embodiment, the pad 270 may be attached to the top and bottom edges of the second film 262.

According to another embodiment, the pad 270 may be attached to one surface of the second plate 220*b*, and may be disposed to surround the second film 262 attached to a portion of the one surface of the second plate 220*a*. As an example, the pad 270 may be formed in a rectangular band shape, and may be attached the one surface of the second plate 220*b* to surround the second film 262. As another example (not illustrated), the pad 270 may include a plurality of pad sections each having a rectangular shape, and the plurality of pad sections may be attached to a portion of the second plate 220*b* corresponding to the top end of the second film 262 and a portion of the second plate 220*b* corresponding to the bottom end of the second film 262.

According to another embodiment (not illustrate), at least one magnet mounting space may be formed in each of the first plate 210*a* and the third plate 210*c*, and no magnet mounting space may be formed in the second plate 210*b*. Accordingly, a first magnet 281 is mounted in the magnet mounting space formed in the first plate 210*a*, and a third magnet 283 is mounted in the magnet mounting space formed in the third plate 210*c*. However, no separate magnet may be mounted in the second plate 210*b*. The second plate 210*b* may be attached to one surface of the electronic device 10 through the frictional force of the pad 270 attached to one surface of the second plate 210*b* without a separate magnet.

That is, the second plate 210*b* may be attached to one surface of the electronic device 10 via the second magnet 282 mounted inside the second plate 210*b* and the pad 270 attached to one surface of the pad provided. However, according to another embodiment, the second plate 210*b* may be attached to one surface of the electronic device 10 the pad 270 without a separate magnet.

Figure 3:
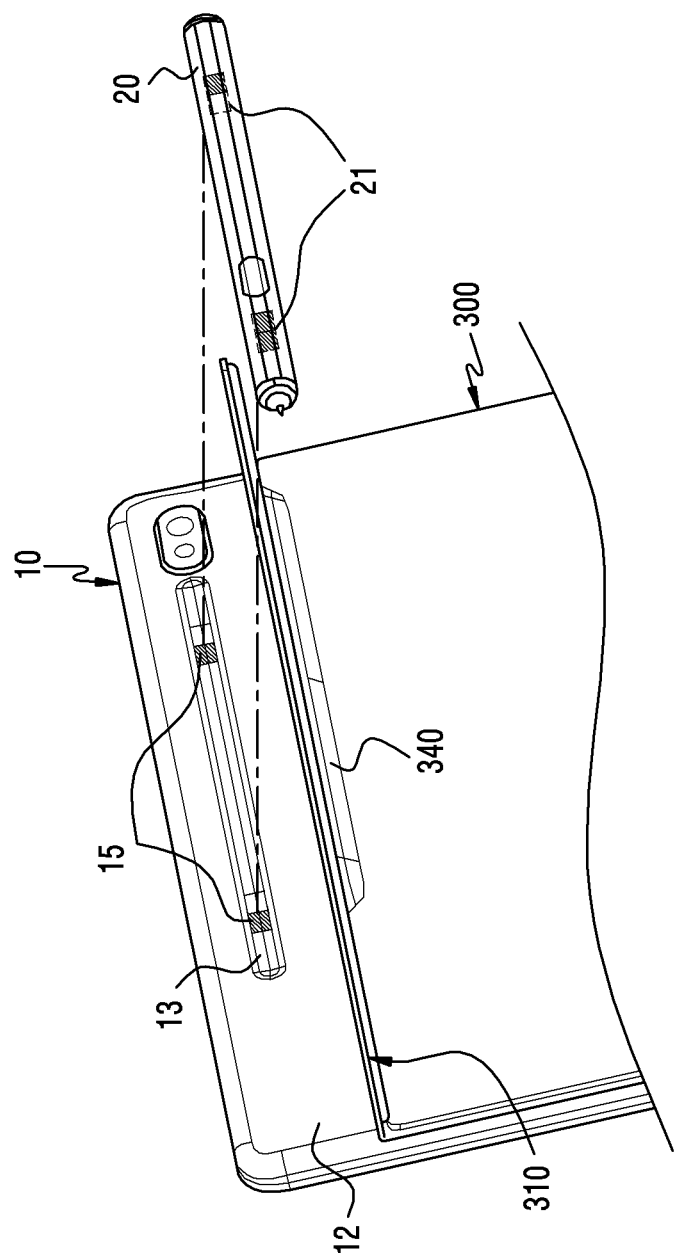
FIG. 3 is a perspective view illustrating a seating recess formed in one surface of an electronic device and a pen.

FIG. 3 is a perspective view illustrating a seating recess 13 formed in one surface of an electronic device 10 and a pen 20.

Referring to FIG. 3, the electronic device 10 according to an embodiment may include a touch screen panel (not illustrated) on which input and output can be simultaneously performed. The touch screen panel may include a first panel for recognizing (or detecting) touch inputs performed by the pen 20 and a second panel for recognizing touch input performed by a user's body, whereby both of the input performed by the user's body (e.g., fingers) and the input performed by the pen 20 can be recognized. As an example, the first panel may recognize input performed by the pen 20 through an electromagnetic magnetic resonance (EMR) method using a change in electromagnetic resonance that occurs when the pen 20 approaches the first panel. As another example, the first panel may recognize input performed by the pen 20 through an active electrostatic (AES) method using static electricity generated by the pen 20.

One or more magnets 15 may be mounted inside the electronic device 10. According to an embodiment, and one or more magnets 21 may also be mounted inside the pen 20. As an example, the one or more magnets 15 mounted inside the electronic device 10 may be disposed at regular intervals, and the one or more magnets 21 mounted inside the pen 20 may be disposed at positions corresponding to the one or more magnets 15 mounted inside the electronic devices. When the pen 20 is attached to one surface (e.g., the rear surface 12) of the electronic device 10, the pen 20 may be affixed to the one surface of the electronic device 10 through magnetic coupling between the one or more magnets 21 mounted inside the pen 20 and the one or more magnets 15 mounted inside the electronic device 10. FIG. 3 illustrates that two magnets are disposed inside each of the electronic device 10 and the pen 20. However, the number of magnets to be utilized is not limited thereto, and according to an embodiment, three, four or more magnets may be disposed inside the electronic device 10.

According to an embodiment, the electronic device 10 may include a wireless charger (not illustrated), and the wireless charger may be disposed inside the electronic device 10 at positions adjacent to the one surface of the electronic device 10 to which the pen 20 is attached. According to an embodiment, the pen 20 used in the electronic device 10 including an "AES-type" touch screen includes a battery (not illustrated) for the purpose of generating static electricity therein. The wireless charger may wirelessly charge the battery inside the pen 20 when the pen 20 is attached to the one surface of the electronic device 10.

According to an embodiment, a seating recess 13 may be formed in the one surface of the electronic device 10, and the pen 20 may be seated in the seating recess 13 so as to be fixed to the one surface of the electronic device 10. As an example, the seating recess 13 may be formed in a shape corresponding to the outer peripheral surface of the pen 20, but is not limited thereto.

According to an embodiment, a cover 300 may be attached to the one surface of the electronic device 10. The cover 300 may include a first region 310 (e.g., the first region 110 in FIG. 1 or the first region 210 in FIG. 2B), which may be spaced apart from the one surface of the electronic device 10 according to a user's operation. In the first region 310, a pen storage part 340 (e.g., the pen storage part 140) capable of providing a space capable of storing the pen may be disposed to protrude from the first region 310. That is, since the pen 20 may be primarily fixedly attached to the one surface of the electronic device 10 through magnetic coupling, and may be secondly stored inside the pen storage unit 340, it is possible for the user to prevent the pen 20 from being damaged by an external impact or to prevent the pen 20 from being lost. A process of storing the pen 20 in the pen storage part 340 will be described in detail below with reference to FIGS. 4A and 4B.

Figure 4A:
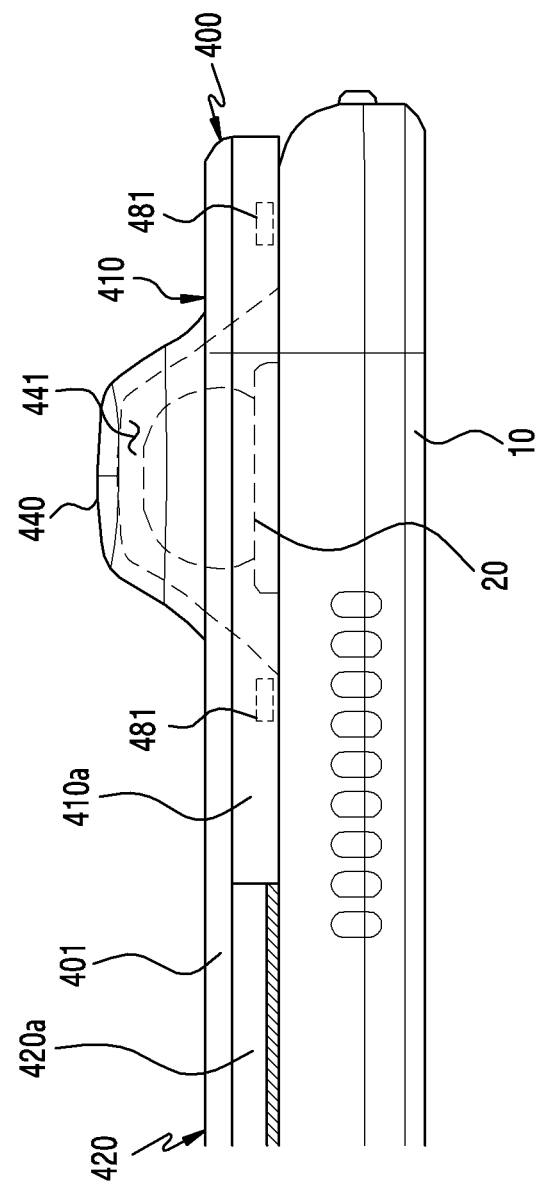
FIG. 4A is a view illustrating the state in which a pen is stored in a pen storage part of a cover according to an embodiment.

FIG. 4A is a view illustrating the state in which the pen 20 is stored in the pen storage part 440 on the cover 400 according to an embodiment. FIG. 4B is a view illustrating the state in which a portion 410 of the cover 400 is spaced apart from one surface of the electronic device 10.

Referring to FIGS. 4A and 4B, the cover 400 according to an embodiment may be attached to at least one surface of the electronic device 10, and may include a first plate 410*a* (e.g., the first plate 210*a* in FIG. 2A), a second plate 420*a* (e.g., the second plate 220*a* in FIG. 2A), an outer skin 401 attached to one surface of each of the first plate 410*a* and the second plate 420*a*, and a pen storage part 440. According to an embodiment, the cover 400 may be divided into a first region 410 and a second region 420 depending on which plate the outer skin 401 is attached to. As an example, among the regions to which the outer skin 401 is attached, a region corresponding to the first plate 410*a* may be distinguished as a first region 410 and a region corresponding to the second plate 420*a* may be distinguished as a second region 420 (e.g., the second region 220 in FIG. 2A). At least one of the components of the cover 400 of FIGS. 4A and 4B may be the same or similar to at least one of the components of the cover 100 of FIG. 1 or the cover 200 of FIGS. 2A to 2E, and a repetitive descriptions will be omitted below.

According to an embodiment, since the first plate 410*a* and the second plate 420*a* are connected by the outer skin 401, the first region 410 and the second region 420 of the cover 400 can be rotated independently. As an example (e.g., FIG. 4A), both the first region 410 and the second region 420 may be attached to one surface of the electronic device 10. However, according to another example (e.g., FIG. 4B), in the state in which the second region 420 is attached to the one surface, the first region 410 may be rotated about the second region 420 so as to be spaced apart from the one surface of the electronic device 10.

According to an embodiment, at least one magnet 481 (e.g., the first magnet 281 in FIG. 2C) may be mounted inside the first plate 410*a*, and at least one magnet (not illustrated) (e.g., the second magnet 282 in FIG. 2C) may be mounted inside the second plate 420*a*. When each of the first region 410 and the second region 420 is attached to the one surface of the electronic device 10, the magnets mounted inside the first plate 410*a* and the second plate 420*a* may enable the first region 410 and the second region 420 to be fixed to the one surface of the electronic device 10.

Referring to FIG. 4A, the pen storage part 440 according to an embodiment may be formed to protrude from a portion of the first plate 410*a*, and a recess 441 may be formed inside the pen storage part 440. When the first region 410 is attached to the one surface of the electronic device 10, an inner space may be formed between the pen storage part 440 and the one surface of the electronic device 10 by the recess 441 formed inside the pen storage part 440, and the pen 20 (e.g., the pen 20 in FIG. 3) attached to the one surface of the electronic device 10 can be stored in the inner space. The recess 441 may be formed in, for example, a shape corresponding to the outer peripheral surface of the pen 20, but is not limited thereto. As long as the inner space in which the pen 20 can be stored can be formed, the recess 441 may be formed in a shape (e.g., a rectangular shape or a triangular shape) different from the shape corresponding to the outer peripheral surface of the pen 20.

According to an embodiment (e.g., FIG. 4A), when the user does not use the pen 20, the pen 20 may be stored in the pen storage part 440, thereby preventing the pen 20 from being lost or damaged by an external impact. In contrast, when it is desired to use the pen 20, the user may rotate the first region 410 of the cover 400 to be spaced apart from the one surface of the electronic device 10. When the first region 410 is spaced apart from the one surface of the electronic device 10, the pen storage part 440 is also spaced apart from the one surface of the electronic device 10 together with the first region 410. Thus, the pen stored inside the pen storage part 440 can be exposed to the outside of the cover 400, and the user can take out and use the exposed pen 20.

Figure 5:
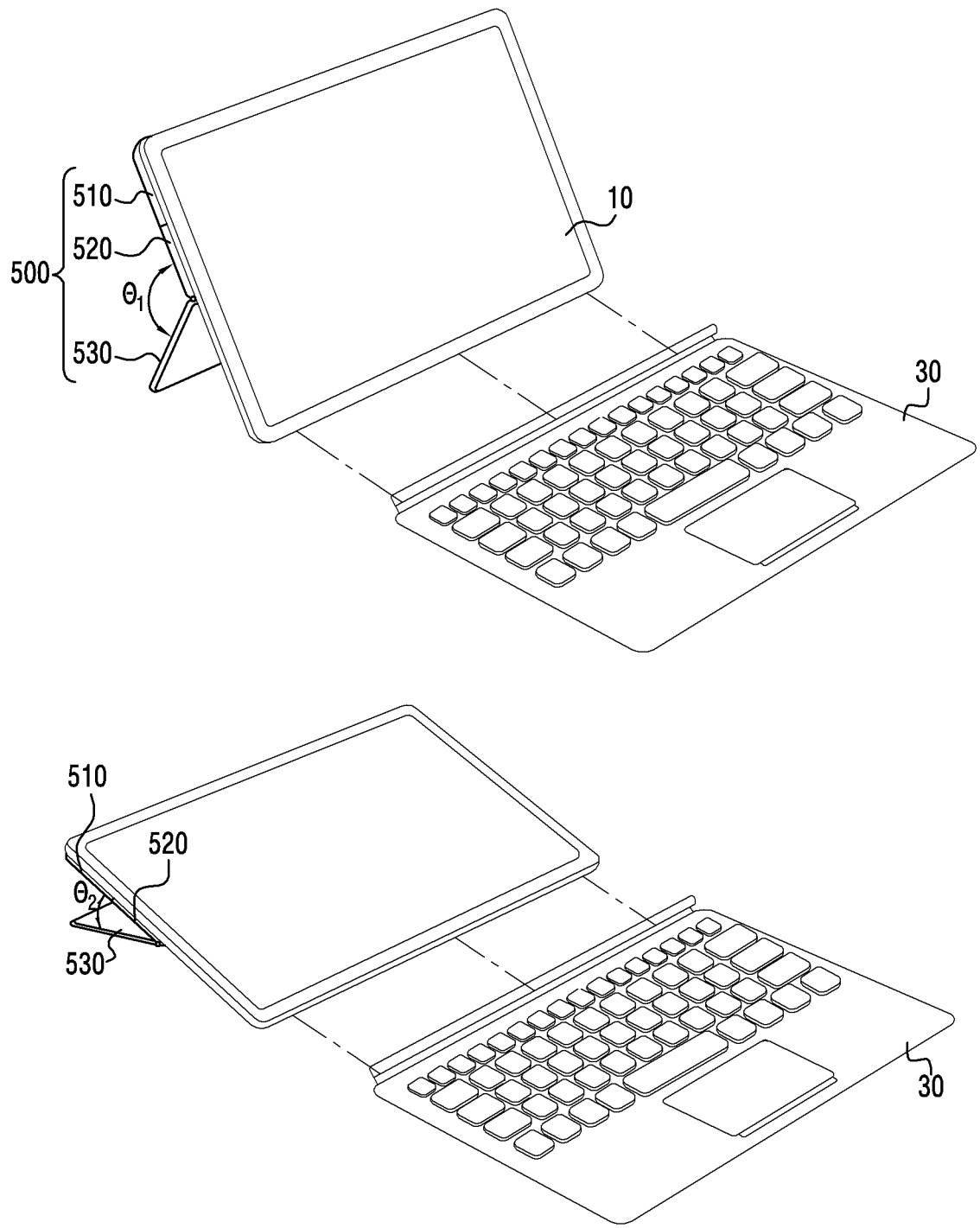
FIG. 5 is a perspective view illustrating the state in which an electronic device is mounted using a cover according to an embodiment.

FIG. 5 is a perspective view illustrating the state in which an electronic device 10 is mounted using a cover 500 according to an embodiment.

Referring to FIG. 5, the cover 500 may be attached to one surface (e.g., the rear surface) of the electronic device 10 according to an embodiment, and the one surface of the electronic device 10 may be protected from an external impact provided by the cover 500.

A keyboard 30 may be detached or attached to one side surface of the electronic device 10 (e.g., the side surface on which a pogo terminal is disposed). According to an embodiment, the user may attach the keyboard 30 to the one side surface of the electronic device 10, or may be detached from the one side surface of the electronic device 10.

According to an embodiment, the cover 500 may include a first region 510 (e.g., the first region 210 in FIG. 2A), a second region 520 (e.g., the second region 220 in FIG. 2A), and a third region 530 (e.g., the third region 230 in FIG. 2A). The second region 520 and the third region 530 may be rotatably coupled to each other via a hinge structure (not illustrated) (e.g., the hinge structure 290 in FIG. 2D). Thus, the third region 530 is rotatable about the second region 520 within a designated angle range.

As an example, the third region 530 may be rotated about the second region 520 such that the angle between the second region 520 and the third region 530 becomes a first angle θ1. At this time, one end of the third region 530 comes into contact with the second region 520 attached to one surface of the electronic device 10, and the other end of the third region 530 may come into contact with the ground. In the state in which the second region 520 is attached to the one surface of the electronic device 10, when the third region 530 is rotated by the first angle θ1 with respect to the second region 520, the electronic device 10 may be mounted using the second region 520 and the third region 530 of the cover 500.

As another example, the third region 530 may be rotated about the second region 520 such that the angle between the second region 520 and the third region 530 becomes a second angle θ2 smaller than the first angle θ1. When the angle between the second region 520 and the third region 530 is the second angle θ2, the angle between the electronic device 10 and the ground is decreased compared to the case where the angle between the second region 520 and the third region 530 is the first angle θ1, whereby the electronic device 10 becomes closer to the ground. That is, as the angle between the second region 520 and the third region 530 is decreased, the angle between the electronic device 10 and the ground is decreased. In contrast, as the angle between the second region 520 and the third region 530 is increased, the angle between the electronic device 10 and the ground is also increased. Thus, the user may change the mounting angle of the electronic device 10 by adjusting the angle between the second region 520 and the third region 530.

Figure 6A:
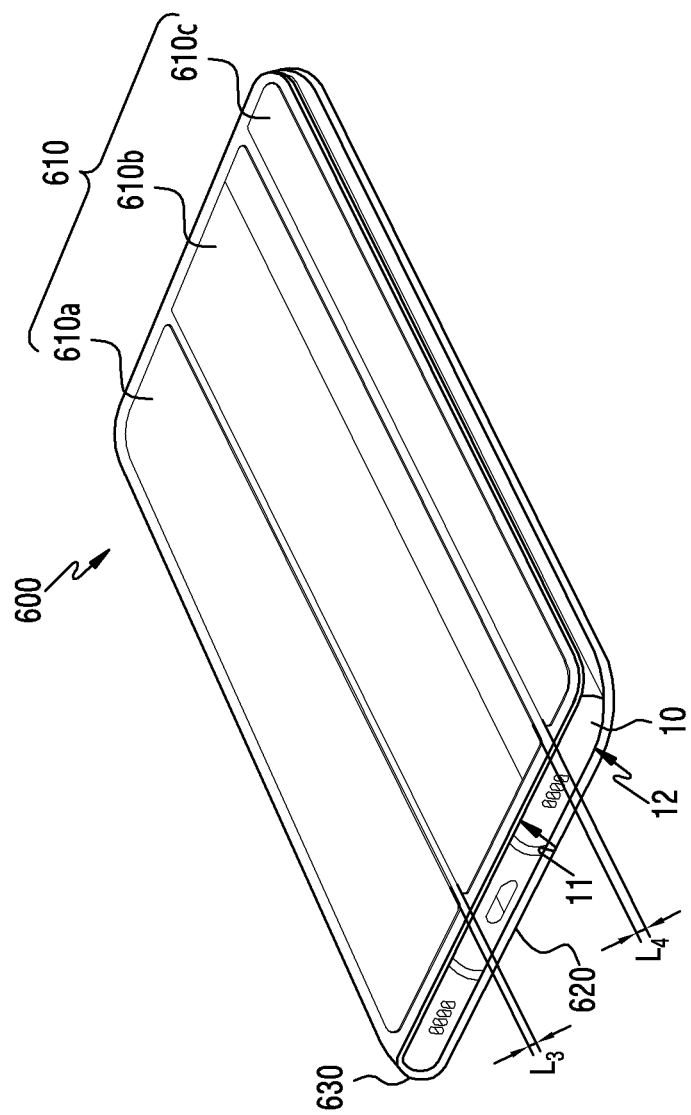
FIG. 6A is a perspective view illustrating the state in which a cover according to certain embodiments is attached to an electronic device.
Figure 6B:
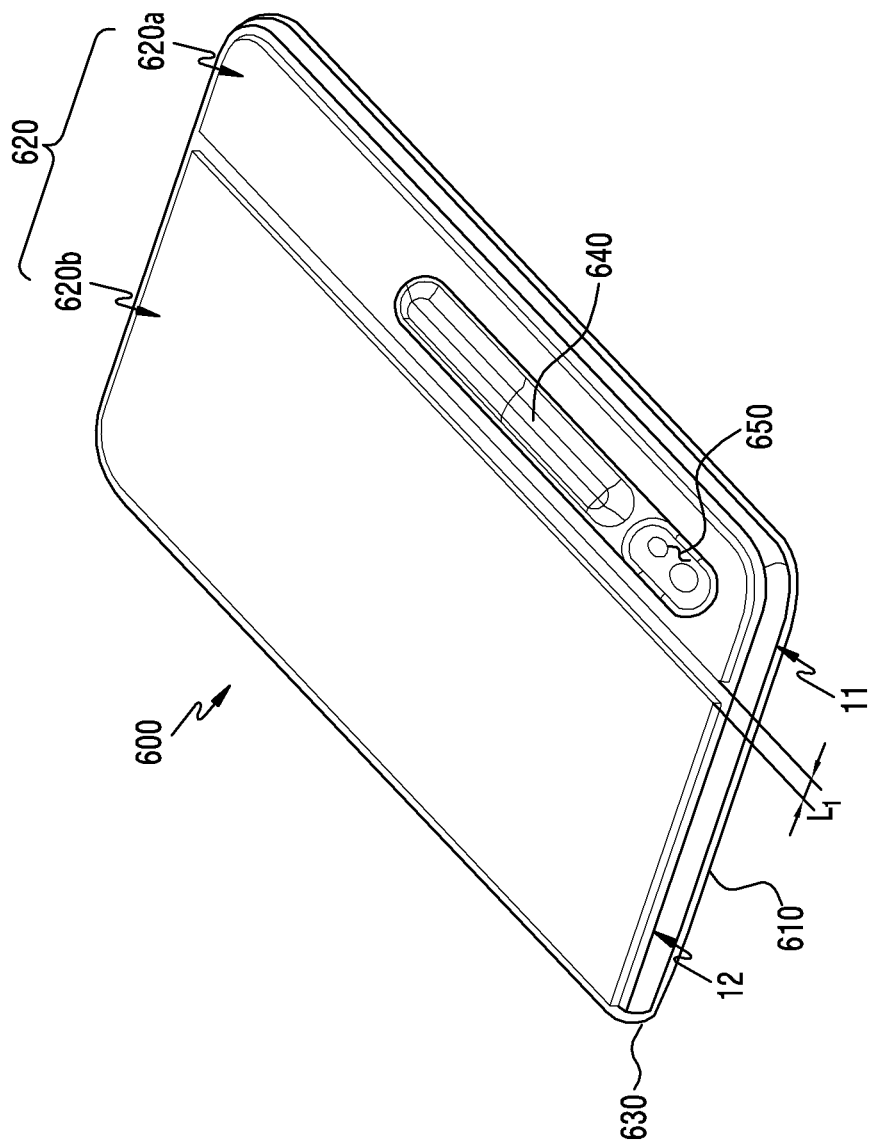
FIG. 6B is a rear side perspective view of the cover of FIG. 6A.
Figure 6C:
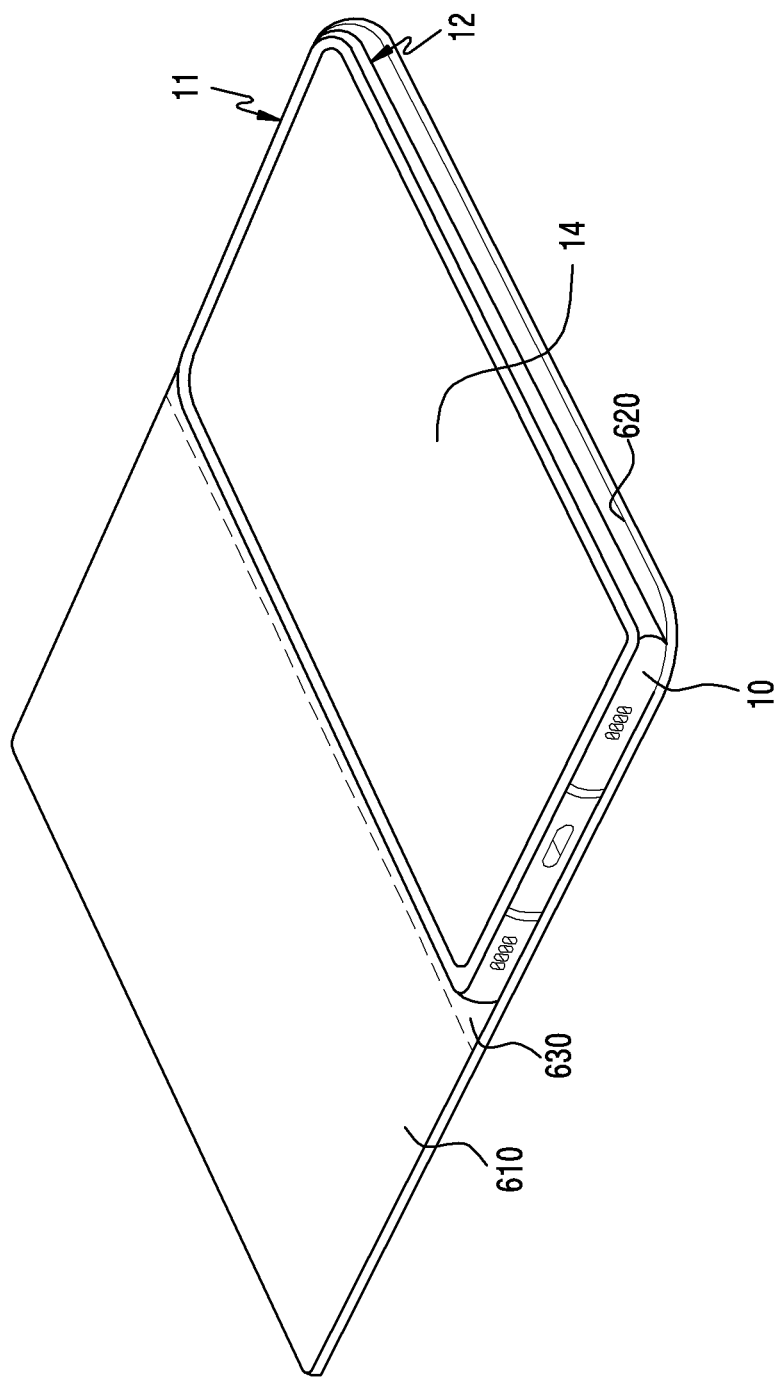
FIG. 6C is a perspective view illustrating the state in which the cover of FIG. 6A is unfolded.

FIG. 6A is a perspective view illustrating the state in which a cover according to certain embodiments is attached to an electronic device. FIG. 6B is a rear side perspective view of the cover of FIG. 6A. FIG. 6C is a perspective view illustrating the state in which the cover of FIG. 6A is unfolded.

Referring to FIGS. 6A, 6B, and 6C, a cover 600 according to an embodiment may include a front cover 610, a rear cover 620, and a side cover 630. The cover 600 is attached to at least one region of the electronic device 10 in the form of a book cover so as to protect the front surface 11, the rear surface 12, and/or one side surface of the electronic device 10.

According to an embodiment, the front cover 610 may cover at least part of the front surface 11 of the electronic device 10 so that components exposed on one surface of the electronic device 10 (e.g., a touch screen 14). The rear cover 620 may cover at least part of the rear surface 12 of the electronic device 10 that is opposite to the front surface 11 of the electronic device 10 so as to protect the rear surface 12 of the electronic device 10. The side cover 630 may be formed to connect the front cover 610 and the rear cover 620 so as to protect the one side surface of the electronic device 10. Since the front cover 610 and the rear cover 620 are connected to each other through the side cover 630, the front cover 610 may be independently rotated about the rear cover 620.

Referring to FIGS. 6A and 6B, according to an embodiment, the cover 600 is in the folded state in which the front cover 610 covers the front surface 11 of the electronic device 10 and the rear cover 620 covers the rear surface of the electronic device 10 so as to protect the front surface 11 and the rear surface 12 of the electronic device 10, respectively. Referring to FIG. 6C, according to another embodiment, the cover 600 may be in the unfolded state (or a flat state) in which the front cover 610 and the rear cover 620 are located on the same plane when the front cover 610 is rotated in the state in which the rear cover 620 is attached to the rear surface of the electronic device 10. When the cover 600 is in the unfolded state, the front surface 11 of the electronic device 10 may be exposed to the outside of the cover 600. As an example, when the cover 600 is changed from the folded state to the unfolded state, the touch screen 14 of the electronic device 10 may be exposed to the outside of the cover 600. That is, according to the use situation of the electronic device 10, the user may rotate the front cover 610 and/or the rear cover 620 to switch the state of the cover 600 (e.g., the folded state or the unfolded state).

Referring to FIG. 6B, the rear cover 620 may be divided into a first region 620a and a second region 620b spaced apart from the first region 620a by a first distance L1, and the first region 620a may be independently rotated about the second region 620b. A detailed description of the process in which the first region 620a is independently rotated about the second region 620b will be described later.

According to an embodiment, a pen storage part 640 may be formed in at least one region of the first region 620a. The pen storage part 640 is formed to protrude from the first region 620a, and when the first region 620a is attached to the rear surface of the electronic device 10, a space capable of storing a pen (not illustrated) may be provided between the rear surface of the electronic device 10 and the first region 620a. According to an embodiment, a hole 650 penetrating the pen storage part 640 may be formed in a portion of the pen storage part 640, and a portion of the electronic device 10 may be exposed to the outside through the hole 650. As an example, even in the state in which the rear cover 620 is attached to the rear surface 12 of the electronic device 10, the camera module disposed on the rear surface 12 of the electronic device 10 may be exposed to the outside through the hole 650.

Referring to FIG. 6A, the front cover 610 may be divided into a third region 610a connected to the second region 620b of the rear cover 620 through the side cover 630, a fourth region 610b spaced apart from the third region 610a by a third interval $L_3$, and a fifth region spaced apart from the fourth region 610b by a fourth interval $L_4$. According to an embodiment, the third region 610a may be independently rotated about the second region 620b through the side cover 630. According to another embodiment, since the fourth region 610b is spaced apart from the third region 610a by the third interval $L_3$, the fourth region 610b may be independently rotated about the third region 610a. According to another embodiment, since the fifth region 610c is spaced apart from the fourth region 610b by the fourth interval $L_4$, the fifth region 610c may be independently rotated about the fourth region 610b. That is, each of the third region 610a, the fourth region 610b, and the fifth region 610c may be independently rotated, and the electronic device 10 may be mounted using the third region 610a, the fourth region 610b, and the fifth region 610c. A detailed description thereof will be described later.

Figure 7:
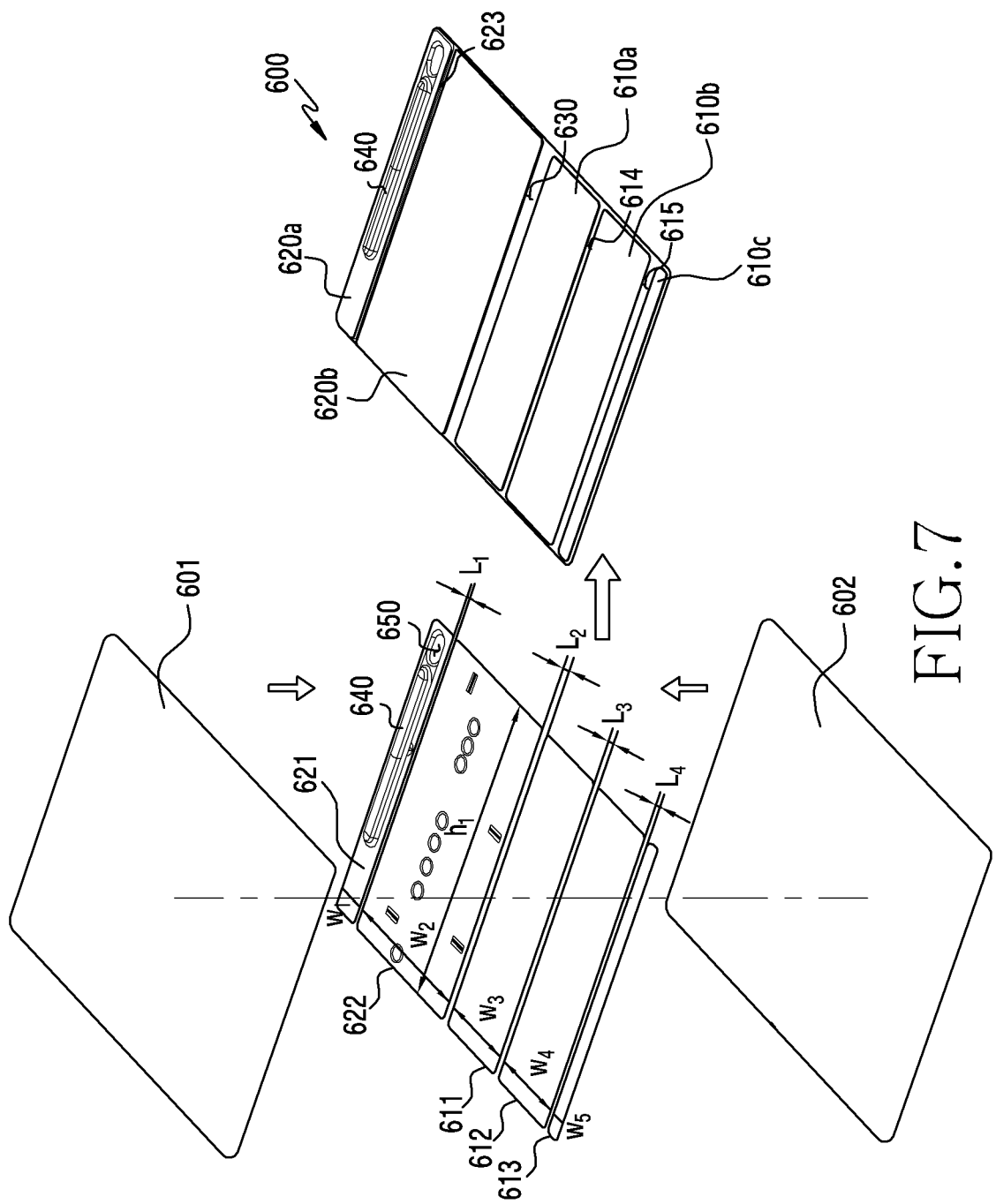
FIG. 7 shows perspective views illustrating a cover according to an embodiment in a disassembled state and an assembled state.

FIG. 7 shows perspective views illustrating a cover 600 according to an embodiment in a disassembled state and an assembled state.

According to an embodiment, in the cover 600, one surface of each of the first plate 621, the second plate 622, the third plate 611, the fourth plate 612, and the fifth plate 613 may be formed by being compression-bonded to an outer skin 601, and the other surface of each of the first plate 621, the second plate 622, the third plate 611, the fourth plate 612, and the fifth plate 613 may be formed by being compression-bonded to an inner skin 602.

According to an embodiment, the rear cover 620 may be formed by compression-bonding the one surface and the other surface of each of the first plate 621 (e.g., having a first width w1 and a first height h1) and the second plate 622 (e.g., having a second width w2 and the first height h1) to the outer skin 601 and the inner skin 602, respectively. The first plate 621 and the second plate 622 are wrapped by the outer skin 601 and the inner skin 602, and thus, are not exposed to the outside of the rear cover 620 (e.g., to an external environment). According to an embodiment, the second width w2 may be two or more times the first width w1, but is not limited thereto. In this disclosure, one region of the rear cover 620 in which the first plate 621 is embedded will be referred to as a "first region 620a", and another region of the rear cover 620 in which the second plate 622 is embedded will be referred to as a "second region 620b".

According to an embodiment, since the first plate 621 and the second plate 622 are compression-bonded to the outer skin 601, and the inner skin 602 is spaced apart from each other by the first gap $L_1$, a first connection region 623 may be formed between the first region 620a and the second region 620b. Since the first region 620a and the second region 620b are connected via the first connection region 623, the first region 620a may be independently rotated about the second region 620b. The outer skin 601 and the inner skin 602 may be formed of, for example, polyurethane (PU), leather, a synthetic material, or a fabric material, but are not limited thereto.

According to an embodiment, a pen storage part 640 may be formed to protrude in at least one region of the first plate 621. According to an embodiment, an opening (not illustrated) may be formed in a region of the first plate 621, and the pen storage part 640 may be disposed in the region of the first plate 621 in a manner of being assembled to the opening. According to another embodiment, the pen storage part 640 may be disposed in the region of the first plate 621 in a manner of being attached to the opening using adhesive tape or through bonding, and according to an embodiment, the pen storage part 640 may be disposed in the region of the first plate 621 in a manner of being welded to the opening. According to another embodiment, the pen storage part 640 may be disposed in the region of the first plate 621 in a manner of being injection-molded in the opening (e.g., through double injection molding or insert injection molding).

According to an embodiment, the first plate 621, the second plate 622 and the pen storage part 640 may be formed of materials having different hardnesses. Depending on the environment in which the cover 600 is used, the case where the pen storage part 640 comes into the ground may occur. When the pen storage part 640 is formed of a material having a high hardness, the pen storage part 640 may be damaged in the process of coming into contact with the ground. Thus, the pen storage part 640 according to an embodiment may be formed of a material having a lower hardness than that of the first plate 621 and the second plate 622. The first plate 621 and the second plate 622 may be formed of a plastic material having excellent rigidity and flatness and good corrosion resistance. As an example, the first plate 621 and the second plate 622 may be formed of an epoxy material. The pen storage part 640 may be formed of thermoplastic polyurethane (TPU) having a hardness lower than that of the epoxy material, but is not limited thereto.

That is, the pen storage part 640 may be formed of a material having a relatively low hardness so as to prevent the pen storage part 640 from being damaged in the process of using the cover 600, and the first plate 621 and the second plate 622 may be formed of a material having a relatively high hardness so as to increase the rigidity and flatness of the cover 600.

According to an embodiment, a hole 650 may be formed in a region of the pen storage part 640 through the region of the pen storage part 640. According to an embodiment, the hole 650 may be a hole formed by processing (e.g., cutting) the region of the pen storage part 640, but according to another embodiment, the hole 650 may be a portion of an opening in which the pen storage part 640 is not disposed.

According to an embodiment, the front cover 610 may be formed by compression-bonding the one surface and the other surface of each of the third plate 611 having a third width w3 and the first height h1, the fourth plate 612 having a fourth width w4 and the first height h1, and the fifth plate 613 having a fifth width w5 and the first height h1 to the outer skin 601 and the inner skin 602, respectively. In this case, the third plate 611, the fourth plate 612, and the fifth plate 613 are wrapped by the outer skin 601 and the inner skin 602 and thus are not exposed to the outside of the front cover 610. According to an embodiment, at least one of the third width w3, the fourth width w4, and the fifth width w5 may be different from the remaining ones, but are not limited thereto. According to an embodiment, the third width w3, the fourth width w4, and the fifth width w5 may be the same. According to another embodiment, the third plate 611, the fourth plate 612, and the fifth plate 613 may be formed of the same epoxy material as the first plate 621 and the second plate 622, but are not limited thereto. In this disclosure, one region of the front cover 610 in which the third plate 611 is embedded will be referred to as a third region 610a, another region of the front cover 610 in which the fourth plate 612 is embedded will be referred to as a fourth region 610b, and still another region in which the fifth plate 613 is embedded will be referred to as a fifth region 610c.

According to an embodiment, the third plate 611 may be compression-bonded to the outer skin 601 and the inner skin 602 in the state of being spaced apart from the second plate 622 by a second interval L2. As a result, a connection region in which no plate is embedded may be formed between the second region 620b of the rear cover 620 and the third region 610a of the front cover 610, and the connection region may serve as a side cover 630 (e.g., the side cover 630 in FIG. 6A).

According to an embodiment, the third plate 611, the fourth plate 612, and the fifth plate 613 may be compression bonded to the outer skin 601 and the inner skin 602 in the state in which the third plate 611 and the fourth plate 612 are spaced apart by a third interval L3 and the fourth plate 612 and the fifth plate 613 are spaced apart from each other by a fourth interval L4. As a result, a second connection region 614 may be formed between the third plate 611 and the fourth plate 612, and a third connection region 615 may be formed between the fourth plate 612 and the fifth plate 613.

Since the third region 610a is connected to the second region 620b of the rear cover 620 via the side cover 630, the third region 610a may be rotated independently of the second region 620b. Since the fourth region 610b is connected to the third region 610a via the second connection region 614, the fourth region 610b may be rotated independently of the third region 610a. Similarly, since the fifth region 610c is connected to the fourth region 610b via the third connection region 615, the fifth region 610c may rotated independently of the fourth region 610b. That is, each of the third region 610a, the fourth region 610b, and the fifth region 610c may be independently rotated, and the electronic device 10 may be mounted depending on the rotated states of the third region 610a, the fourth region 610b, and the fifth region 610c of the cover 610. A detailed description thereof will be described later.

Figure 8A:
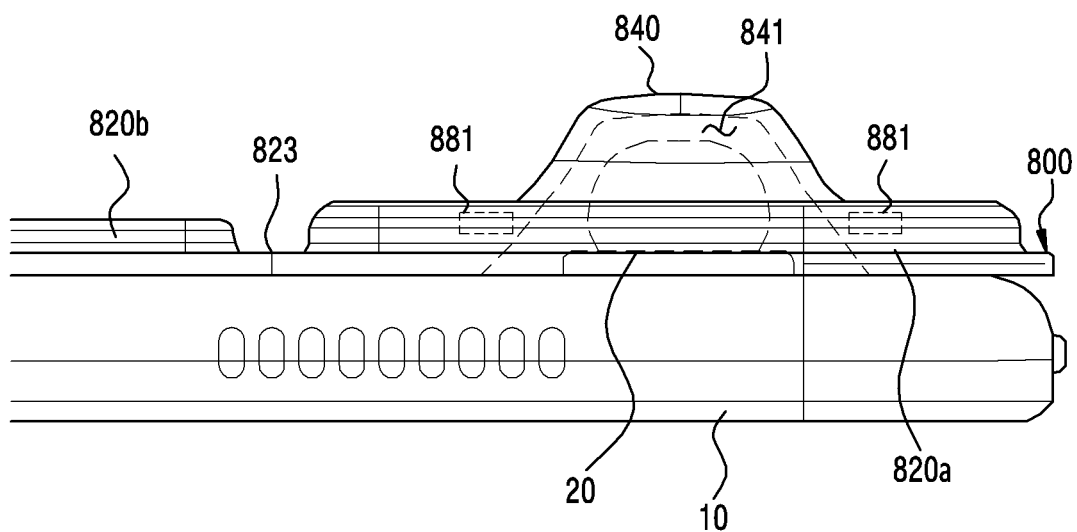
FIG. 8A is a view illustrating the state in which a pen is stored in a pen storage part of a cover according to an embodiment.
Figure 8B:
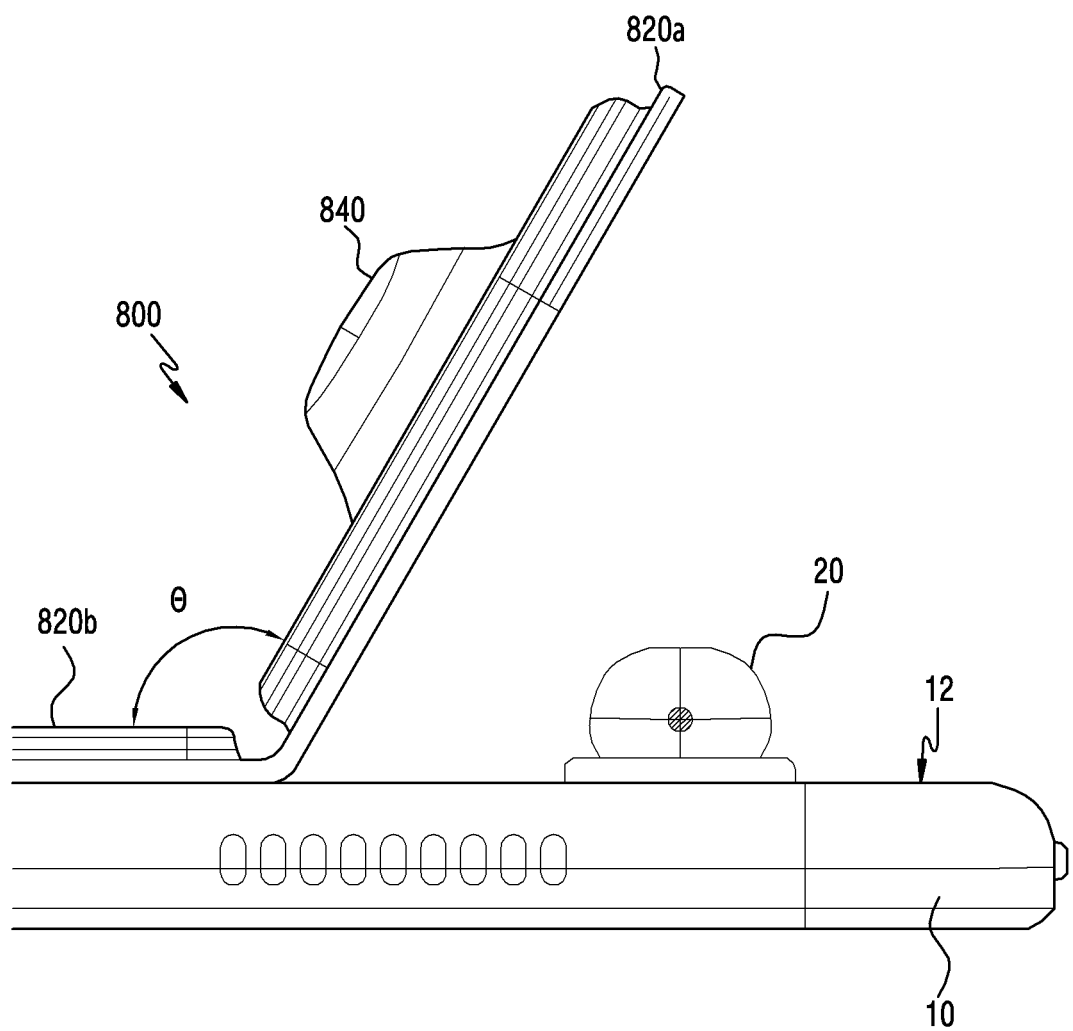
FIG. 8B is a view illustrating the state in which a portion of the cover is spaced apart from one surface of an electronic device.

FIG. 8A is a view illustrating the state in which the pen 20 is stored in the pen storage part 840 on the cover 800 according to an embodiment. FIG. 8B is a view illustrating the state in which a portion 820a of the cover 800 is spaced apart from one surface (e.g., the rear surface 12) of the electronic device 10.

Referring to FIGS. 8A and 8B, the cover 800 according to an embodiment may be attached to at least one surface (e.g., the rear surface 12) of the electronic device 10, and may include a first region 820a (e.g., the first region 620a in FIG. 7), a second region 820b (e.g., the second region 620b in FIG. 7), and a pen storage part 840 (e.g., the pen storage part 740 in FIG. 7). At least one of the components of the cover 800 may be the same as or similar to at least one of the components of the cover 600 of FIGS. 6A to 6C or the cover 600 of FIG. 7, and a repetitive description thereof will be omitted.

According to an embodiment, the first region 820a and the second region 820b may be connected to each other via a connection region 823 (e.g., the first connection region 623 in FIG. 7) in the state of being spaced apart from each other by a predetermined interval (e.g., L1 in FIG. 7). Since the first region 820a and the second region 820b are connected via the first connection region 823, the first region 820a may be independently rotated within a range of angles θ with respect to the second region 820b. According to an embodiment, the first region 820a may be rotated about the second region 820b within an angle range of 25 degrees to 180 degrees, but the designated angle range may be changed according to an embodiment. According to one example (e.g., FIG. 8A), both of the first region 820a and the second region 820b may be attached to the rear surface 12 of the electronic device 10, but according to another example (e.g., FIG. 8B), the first region 820a may be rotated about the second region 820b in the state in which the second region 820b is attached to the rear surface 12 of the electronic device 10 so as to be spaced apart from the rear surface 12 of the electronic device 10. According to an embodiment, at least one first magnet 881 may be disposed inside the first region 820a, and when the first region 820a is attached to the one surface of the electronic device 10, the at least one first magnet 360 may enable the first region 300a to be fixed to the one surface of the electronic device 301.

According to an embodiment, the pen storage part 840 according to an embodiment may be formed to protrude with reference to the first region 820a, and a recess 841 may be formed inside the pen storage part 840. Due to the recess 841 formed inside of the pen storage part 840, when the first region 820a is attached to the one surface of the electronic device 10, an inner space may be formed between the pen storage part 840 and the one surface of the electronic device 10. The pen 20 (e.g., the pen 20 in FIG. 3) attached to the one surface of the electronic device 10 may be stored within the inner space, as illustrated in FIG. 8A. According to an embodiment, the recess 841 may be formed in a shape corresponding to the outer peripheral surface of the pen 20, but is not limited thereto. As long as the inner space capable of storing the pen 20 can be formed, the recess 441 may be formed in a shape (e.g., a rectangular shape or a triangular shape) different from the shape corresponding to the outer peripheral surface of the pen 20. According to an embodiment (e.g., FIG. 8A), when the user does not use the pen 20, the pen 20 may be stored in the pen storage part 840, thereby preventing the pen 20 from being lost or damaged by an external impact. In contrast, when it is desired to use the pen 20, the user may rotate the first region 820a about the second region 820b to be spaced apart from the one surface of the electronic device 10. When the first region 410 is spaced apart from the one surface of the electronic device 10, the pen storage part 840 is also spaced apart from the one surface of the electronic device 10 therewith. Thus, the pen stored inside the pen storage part 840 can be exposed to the outside of the cover 800, and the user can take out and use the exposed pen 20.

Figure 9A:
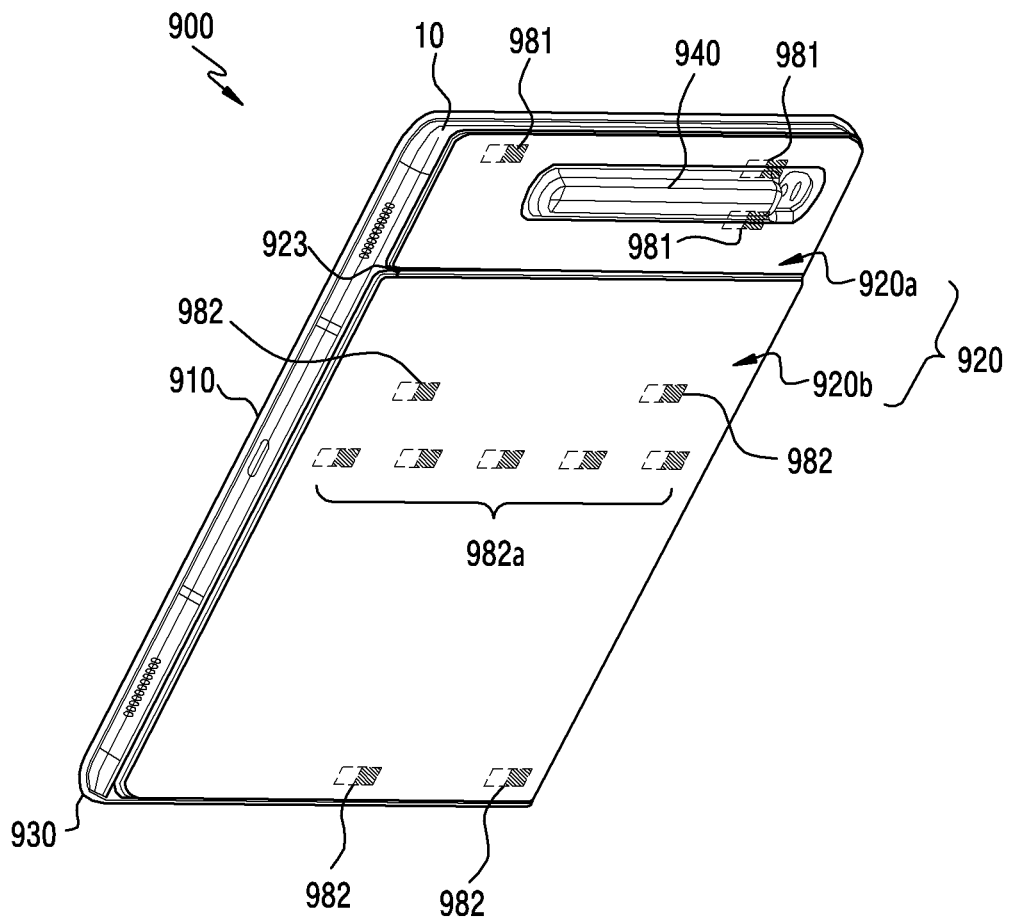
FIG. 9A is a perspective view illustrating the state in which a cover according to an embodiment is attached to the front and rear surfaces of an electronic device.
Figure 9B:
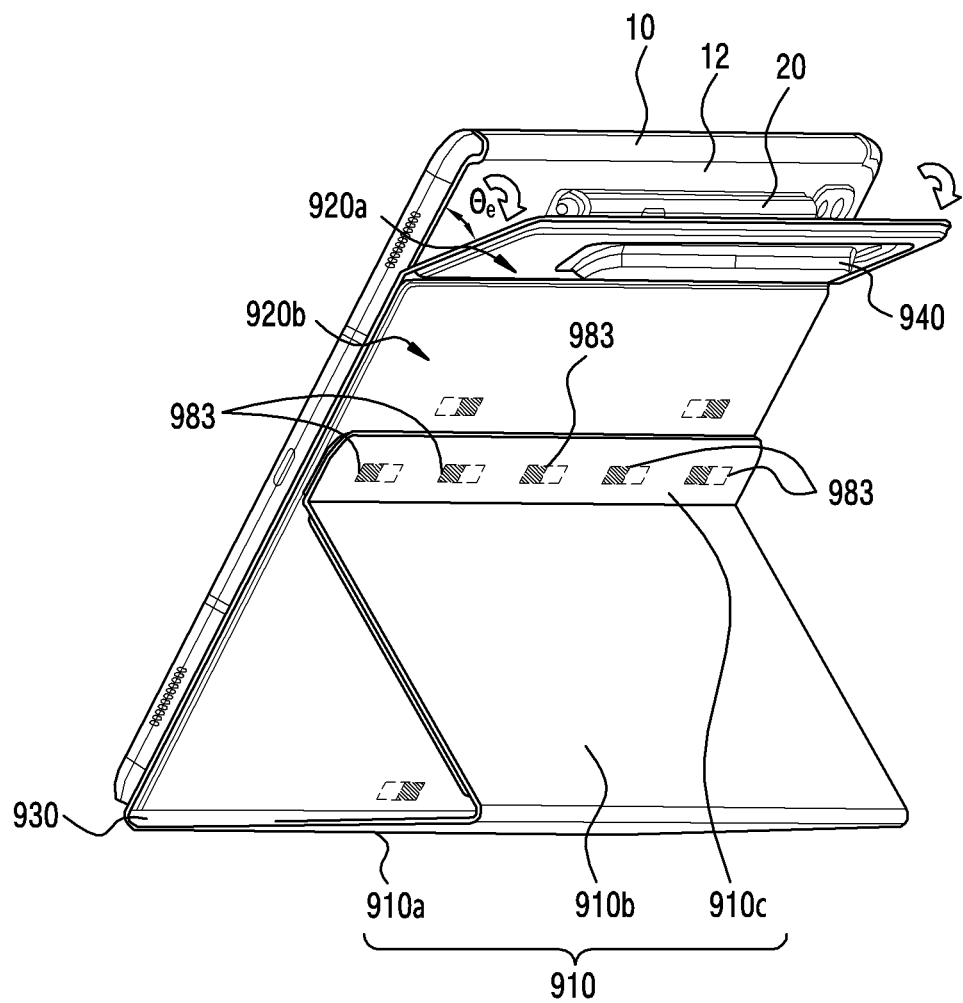
FIG. 9B is a perspective view illustrating the state in which a portion of the cover of FIG. 9A is folded and the electronic device is mounted by the cover.

FIG. 9A is a perspective view illustrating the state in which a cover 900 according to an embodiment is attached to the front surface and the rear surface 12 of an electronic device 10. FIG. 9B is a perspective view illustrating the state in which some regions 910a, 910b, and 910c of the cover 900 of FIG. 9A are folded and the electronic device 10 is mounted using the cover 900.

Referring to FIGS. 9A and 9B, the cover 900 according to an embodiment may include a front cover 910, a rear cover 920, and a side cover 930 connecting the front cover 910 and the rear cover 920. At least one of the components of the cover 900 may be the same as or similar to at least one of the components of the cover 600 of FIG. 7, and a repetitive description thereof will be omitted below.

According to an embodiment, the rear cover 920 may be attached to the rear surface of the electronic device 10. The rear cover 920 may be divided into a first region 920a and a second region 920b spaced apart from the first region 920a by a predetermined distance (e.g., L1 in FIG. 7), and the first region 920a and the second region 920b may be connected by a first connection region 923 (e.g., the first connection region 623 in FIG. 7). Since the first region 920a and the second region 920b are connected via the first connection region 923, the first region 920a may be independently rotated about the second region 920b. As an example, in the state in which the second region 920b is attached to the rear surface 12 of the electronic device 10, the first region 920a may be rotated within a designated angle range θe with respect to the rear surface 12 of the electronic device 10. The designated angle range θe may be, for example, 0 degrees to 155 degrees, but is not limited thereto.

According to an embodiment, a pen storage part 940 is formed to protrude in the first region 920a. Thus, when the first region 920a is rotated, the pen storage part 940 may be spaced apart from one surface (e.g., the rear surface 12) of the electronic device 10 or may be attached to the one surface of the electronic device 10. As an example (e.g., FIG. 9A), when the first region 920a is attached to the one surface of the electronic device 10, the pen 20 may be stored between the pen storage part 940 and the one surface of the electronic device 10. As another example (e.g., FIG. 9B), when the first region 920a is rotated to be spaced apart from the one surface of the electronic device 10, the pen storage part 940 is also spaced apart from the one surface of the electronic device 10 and thus the pen 20 attached to the one surface of the electronic device 10 may be exposed to the outside of the cover 900.

According to an embodiment, one or more first magnets 981 may be mounted inside the first region 920a, and one or more second magnets 982 may be mounted inside the second region 920b. The one or more first magnets 981 and 982 are magnetically coupled with magnets (not illustrated) embedded in the electronic device 10 so as to affix the first region 920a and the second region 920b together, when the first region 920a and the second region 920b are attached to the one surface of the electronic device 10. As an example, the first magnets 981 may be mounted in a region adjacent to the pen storage part 940 and an edge of the first region 920a, and the second magnets 982 may be mounted adjacent to an edge of the second region 920b.

According to an embodiment, the front cover 910 may be attached to the front surface of the electronic device 10, and the front cover 910 may include a third region 910a (e.g., the third region 610a in FIG. 7), a fourth region 910b (e.g., the fourth region 610b in FIG. 7), and a fifth region 910c (e.g., the fifth region 610c in FIG. 7). According to an embodiment, the third region 910a and the fourth region 910b may be connected to each other via a second connection region (e.g., the second connection region 614 in FIG. 7) in the state of being spaced apart from each other by a third interval (e.g., L3 in FIG. 7). Since the third region 910a and the fourth region 910b are connected via the second connection region, the fourth region 910b may be rotated independently of the third region 910a. Since the third region 910a is connected to the second region 920b of the rear cover 920 via the side cover 930 (e.g., the side cover 630 in FIG. 7), the third region 910a may be rotated independently of the second region 920b. According to another embodiment, the fourth region 910b and the fifth region 910c may be connected to each other via a third connection region (e.g., the third connection region 615 in FIG. 7) in the state of being spaced apart from each other by a fourth interval (e.g., L4 in FIG. 7). Since the fourth region 910b and the fifth region 910c are connected to each other via the second connection region, the fifth region 910c may be rotated independently of the fourth region 910b. That is, each of the third region 910a, the fourth region 910b, and the fifth region 910c may be independently rotated, and the electronic device 10 may be mounted depending on the rotated states of the third region 910a, the fourth region 910b, and the fifth region 910c of the front cover 910.

Referring to FIG. 9B, according to an embodiment, the third region 910a is rotated about the second region 920b such that one surface of the third region 910a can be in contact with the ground. The fourth region 910b is rotated about the third region 910a such that one end of the fourth region 910b can be in contact with the ground and the other end can be in contact with the second region 920b of the back cover 920. The fifth region 910c is rotated about the fourth region 910b such that one surface of the fifth region 910c can be attached to one region of the second region 920b of the rear cover 920. As a result, the third region 910a, the fourth region 910b, and the fifth region 910c may be arranged in a triangular structure when viewed from a lateral side. That is, according to an embodiment, the front cover 910 may be bent into a designated structure (e.g., a triangular structure), and may allow the electronic device 10 to be mounted.

According to an embodiment, a plurality of third magnets 983 may be mounted at a predetermined interval inside the fifth region 910c, and a plurality of magnets 982a may be mounted in a region of the second region 920b that corresponds to a region to which the fifth region 910c is attached. As described above, when the fifth region 910c is attached to a region of the second region 920b, the plurality of third magnets 983 mounted inside the fifth region 910c and the plurality of magnets 982a mounted inside the second region 920b may be magnetically coupled to each other. That is, through the plurality of third magnets 983 mounted inside the fifth region 910c and the plurality of magnets 982a mounted inside the second region 920b, the fifth region 910c can be fixed to the second region 920b. As a result, the electronic device 10 can be stably mounted.

A cover (e.g., the cover 200 in FIG. 2A) according to certain embodiments relates to a cover attached to an electronic device. The cover includes: a first plate (e.g., the first plate 210a in FIG. 2A) having an opening (not illustrated) in a region thereof and configured to cover a rear surface of the electronic device; a second plate (e.g., the second plate 220a in FIG. 2A) located adjacent to the first plate and configured to cover the rear surface of the electronic device; a third plate (e.g., the third plate 230a in FIG. 2A) located adjacent to the second plate and configured to cover the rear surface of the electronic device; a pen storage part (e.g., the pen storage part 240 in FIG. 2A) coupled to the opening of the first plate; an outer skin (e.g., the outer skin 201 in FIG. 2A) configured to wrap one surface of each of the first plate, the second plate, and the third plate; and a hinge structure (e.g., the hinge structure 290 in FIG. 2D) configured to rotatably couple the second plate and the third plate to each other, wherein the first plate is configured to be rotatable in a designated angle range with respect to the second plate via the outer skin, the third plate is configured to be rotatable in a designated angle range with respect to the second plate via the hinge structure, and the first plate is formed of a first material, and the pen storage part is formed of a second material having a hardness different from a hardness of the first material.

According to an embodiment, the electronic device may further include at least one magnet (e.g., the first magnet 281 in FIG. 2C) mounted inside the first plate and at least one third magnet (e.g., the third magnet 283 in FIG. 2C) mounted inside the third plate.

According to an embodiment, the second plate may be configured to be attachable to at least one region of the rear surface of the electronic device.

According to an embodiment, a film (e.g., the film 260 in FIG. 2C) may be attached to another surface opposite to the one surface of each of the first plate, the second plate, and the third plate to which the outer skin is attached.

According to an embodiment, the second plate may further include a pad attached to the another surface, and the pad may be configured to prevent slipping when the second plate is attached to the rear surface of the electronic device.

According to an embodiment, the third plate may be configured to be rotatable within an angle range of 10 degrees to 180 degrees with respect to the second plate.

According to an embodiment, the first member may have a hardness higher than the hardness of the second material.

According to an embodiment, the first material may be polycarbonate (PC), and the second material may be thermoplastic polyurethane (TPU).

According to an embodiment, the pen storage part may have a hole (e.g., the hole 150 in FIG. 1) formed in one region thereof, and when the cover is attached to the electronic device, at least a portion of the rear surface of the electronic device may be exposed to the outside through the hole.

According to an embodiment, the first plate may have a first width w1 and a first height h1, the second plate may have a second width w2 and the first height h1, and the third plate may have a third width w3 and the first height h1.

A cover (e.g., the cover 600 in FIG. 7) according to certain embodiments is a cover attached to an electronic device. The cover may include: a plurality of plates (e.g., 611, 612, and 613 in FIG. 7) configured to cover a front surface of the electronic device; a first plate (e.g., the first plate 621 in FIG. 7) having an opening formed in at least one region thereof and configured to cover a rear surface of the electronic device; a second plate (e.g., the second plate 622 in FIG. 7) spaced apart from the first plate by a first interval (e.g., L1 in FIG. 7) and configured to cover the rear surface of the electronic device; a pen storage part (e.g., the pen storage part 640 in FIG. 7) coupled to the opening of the first plate; an outer skin (e.g., the outer skin 601 in FIG. 7) configured to wrap one surface of each of the plurality of plates, the first plate, and the second plate; and an inner skin (e.g., the inner skin 602 in FIG. 7) configured to wrap another surface of each of the plurality of plates, the first plate, and the second plate, wherein the first plate may be configured to be rotatable about the first interval in a designated angle range with respect to the second plate via the outer skin, and the first plate may be formed of a first material, and the pen storage part may be formed of a second material having a hardness different from a hardness of the first material.

According to an embodiment, the first plate may be configured to be rotatable within an angle range of 25 degrees to 180 degrees with respect to the second plate.

According to an embodiment, the first member may have a hardness higher than the hardness of the second material.

According to an embodiment, the first material may be epoxy, and the second material may be thermoplastic polyurethane (TPU).

According to an embodiment, the cover may further include at least one first magnet (e.g., the first magnet 981 in FIG. 9A) disposed inside the first plate, and at least one second magnet (e.g., the second magnet 982 in FIG. 9A) disposed inside the second plate.

According to an embodiment, the first plate may have a first width w1 and a first height h1, and the second plate may have a second width w2 and the first height h1.

According to an embodiment, the second width w2 may be two or more times the first width w1.

According to an embodiment, the plurality of plates may include: a third plate (e.g., the third plate 611 in FIG. 7) spaced apart from the second plate by a second interval (e.g., L2 in FIG. 7) and having a third width w3 and the first height h1; a fourth plate (e.g., the fourth plate 612 in FIG. 7) spaced apart from the third plate by a third interval (e.g., L3) and having a fourth width w4 and the first height h1; and a fifth plate (e.g., the fifth plate 613 in FIG. 7) spaced apart from the fourth plate by a fourth interval (e.g., L4 in FIG. 7) and having a fifth width w5 and the first height h1, wherein the third plate may be configured to be rotatable about the second interval with respect to the second plate, the fourth plate may be configured to be rotatable about the third interval with respect to the third plate, and the fifth plate may be configured to be rotatable about the fourth interval with respect to the fourth plate.

The fifth plate may include at least one third magnet (e.g., the third magnet 983 in FIG. 9B) disposed inside the fifth plate.

An electronic device (e.g., the electronic device 10 in FIG. 3) according to certain embodiments may include: a cover (e.g., the cover 300 in FIG. 3) configured to be attachable to a rear surface of the electronic device; a seating recess (e.g., the seating recess 13 in FIG. 3) formed in the rear surface of the electronic device; and a pen (e.g., the pen 20 in FIG. 3) configure to be seated in the seating recess, wherein the cover may include: a first plate (e.g., the first plate 210a in FIG. 2A) having an opening in a region thereof and configured to cover a rear surface of the electronic device; a second plate (e.g., the second plate 220a in FIG. 2A) located adjacent to the first plate and configured to cover the rear surface of the electronic device; a third plate (e.g., the third plate 230a in FIG. 2A) located adjacent to the second plate and configured to cover the rear surface of the electronic device; a pen storage part (e.g., the pen storage part 240 in FIG. 2A) coupled to the opening in the first plate so as to provide a space capable of storing the pen; an outer skin (e.g., the outer skin 201 in FIG. 2A) configured to wrap one surface of each of the first plate, the second plate, and the third plate; and a hinge structure (e.g., the hinge structure 290 in FIG. 2D) configured to rotatably couple the second plate and the third plate to each other, wherein the first plate may be configured to be rotatable in a designated angle range with respect to the second plate via the outer skin, the third plate may be configured to be rotatable in a designated angle range with respect to the second plate via the hinge structure, the first plate may be formed of a first material, and the pen storage part may be formed of a second material having a hardness lower than the hardness of the first material.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, modifications and changes may be made thereto without departing from the disclosure. Therefore, the disclosure should not be defined as being limited to the embodiments, but should be defined by the appended claims and equivalents thereof

What is claimed is:

1. A cover attachable to an electronic device, the cover comprising:
    a first plate having a recess protruding from a surface of the first plate and a through hole to expose a camera of the electronic device, the first plate configured to cover a first part of a rear surface of the electronic device;
    a second plate disposed adjacent to the first plate and configured to cover a second part of the rear surface of the electronic device;
    a third plate disposed adjacent to the second plate and configured to cover a third part of the rear surface of the electronic device;
    a pen storage part coupled to the recess of the first plate, forming an inner space between the pen storage part and the first part of the electronic device;
    an outer skin configured to wrap one surface of each of the first plate, the second plate, and the third plate; and
    a hinge configured to rotatably couple the second plate and the third plate, wherein the first plate is rotatable within a first designated angle range with respect to the second plate via the outer skin, wherein the third plate is rotatable within a second designated angle range with respect to the second plate via the hinge, and wherein the first plate is formed of a first material, and the pen storage part is formed of a second material having a hardness different from a hardness of the first material, wherein the first plate has dimensions including a first width and a first height, and the second plate has dimensions including a second width which is at least twice as wide as the first width, and the first height.

2. The cover of claim 1, further comprising:
at least a first magnet and a second magnet, the first magnet disposed inside the first plate, and the second magnet disposed inside the third plate.

3. The cover of claim 2, wherein the second plate is configured to be attachable to at least one region of the rear surface of the electronic device.

4. The cover of claim 3, wherein a film is attached to another surface of the electronic device, the another surface disposed opposite to at least one surface from among surfaces of the first plate, the second plate, and the third plate, to which the outer skin is attached.

5. The cover of claim 4, wherein the second plate further includes a pad attached to the another surface, and
wherein the pad is configured to prevent slippage between the second plate while attached to the rear surface of the electronic device.

6. The cover of claim 1, wherein the third plate is configured to be rotatable with respect to the second plate within an angle range of 10 degrees to 180 degrees.

7. The cover of claim 1, wherein the first material has a hardness higher than a hardness of the second material.

8. The cover of claim 6, wherein the first material is polycarbonate (PC), and the second material is thermoplastic polyurethane (TPU).

9. A cover attachable to an electronic device, the cover comprising:
a plurality of plates configured to cover a front surface of the electronic device;
a first plate having an a recess protruding from a surface of the first plate and a through hole exposing a camera of the electronic device, and configured to cover a first part of a rear surface of the electronic device;
a second plate spaced apart from the first plate by a first interval and configured to cover a second part of the rear surface of the electronic device;
a pen storage part coupled to the recess of the first plate, forming an inner space between the pen storage part and the first part of the electronic device;
an outer skin configured to wrap a first set of surfaces of each of the plurality of plates, the first plate, and the second plate; and
an inner skin configured to wrap a second set of surfaces of each of the plurality of plates, the first plate, and the second plate, wherein the first plate is configured to be rotatable about the first interval within a designated angle range with respect to the second plate via the outer skin, wherein the first plate is formed of a first material, and the pen storage part is formed of a second material having a hardness different from a hardness of the first material, wherein the first plate has dimensions including a first width and a first height, and the second plate has dimensions including a second width which is at least twice as wide as the first width, and the first height.

10. The cover of claim 9, wherein the first plate is configured to be rotatable within an angle range of 25 degrees to 180 degrees with respect to the second plate.

11. The cover of claim 9, wherein the first material has a hardness higher than a hardness of the second material.

12. The cover of claim 11, wherein the first material is epoxy, and the second material is thermoplastic polyurethane (TPU).

13. The cover of claim 9, further comprising:
at least a first magnet and a second magnet, the first magnet disposed inside the first plate and the second magnet disposed inside the second plate.

14. The cover of claim 9, wherein the plurality of plates include:
a third plate spaced apart from the second plate by a second interval and having dimensions including a third width and the first height;
a fourth plate spaced apart from the third plate by a third interval and having dimensions including fourth width and the first height; and
a fifth plate spaced apart from the fourth plate by a fourth interval and having dimensions including a fifth width and the first height, wherein the third plate is configured to be rotatable about the second interval with respect to the second plate, wherein the fourth plate is configured to be rotatable about the third interval with respect to the third plate, and wherein the fifth plate is configured to be rotatable about the fourth interval with respect to the fourth plate.

15. The cover of claim 14, wherein the fifth plate includes at least a third magnet disposed inside the fifth plate.

* * * * *